(12) United States Patent
Sakiyama et al.

(10) Patent No.: US 11,923,321 B2
(45) Date of Patent: Mar. 5, 2024

(54) THREE-DIMENSIONAL MEMORY DEVICE INCLUDING DIELECTRIC RAILS FOR WARPAGE REDUCTION AND METHOD OF MAKING THE SAME

(71) Applicant: SANDISK TECHNOLOGIES LLC, Addison, TX (US)

(72) Inventors: Shin Sakiyama, Yokkaichi (JP); Genta Mizuno, Yokkaichi (JP); Kenzo Iizuka, Yokkaichi (JP); Takayuki Yokoyama, Yokkaichi (JP); Toshiyuki Sega, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/574,182

(22) Filed: Jan. 12, 2022

(65) Prior Publication Data
US 2023/0223356 A1 Jul. 13, 2023

(51) Int. Cl.
*H01L 23/00* (2006.01)
*H01L 25/00* (2006.01)
(Continued)

(52) U.S. Cl.
CPC .......... *H01L 23/562* (2013.01); *H01L 24/08* (2013.01); *H01L 24/80* (2013.01);
(Continued)

(58) Field of Classification Search
CPC ........ H10B 43/27; H10B 43/35; H10B 43/40; H10B 43/10; H10B 43/50; H10B 63/20;
(Continued)

(56) References Cited

U.S. PATENT DOCUMENTS 9,343,358 B1 5/2016 Xu
9,419,135 B2 8/2016 Baenninger et al.
(Continued)

OTHER PUBLICATIONS

Notification of Transmittal of the International Search Report and Written Opinion of the International Searching Authority for International Patent Application No. PCT/US2022/029742, dated Oct. 19, 2022, 10 pages.
(Continued)

*Primary Examiner* — Telly D Green
(74) *Attorney, Agent, or Firm* — THE MARBURY LAW GROUP PLLC

(57) ABSTRACT

A memory die includes dielectric isolation rails embedded within a substrate semiconductor layer, laterally spaced apart along a first horizontal direction, and each laterally extending along a second horizontal direction that is perpendicular to the first horizontal direction, and alternating stacks of insulating layers and electrically conductive layers located over the substrate semiconductor layer. The alternating stacks are laterally spaced apart along the second horizontal direction by line trenches that laterally extend along the first horizontal direction. Arrays of memory stack structures are provided such that each array of memory stack structures among the arrays of memory stack structures vertically extends through a respective alternating stack. Each of the memory stack structures includes a respective vertical stack of memory elements and a respective vertical semiconductor channel.

20 Claims, 33 Drawing Sheets

(51) Int. Cl.
  *H01L 25/065* (2023.01)
  *H01L 25/18* (2023.01)
  *H10B 41/27* (2023.01)
  *H10B 43/27* (2023.01)

(52) U.S. Cl.
  CPC .......... *H01L 25/0657* (2013.01); *H01L 25/18* (2013.01); *H01L 25/50* (2013.01); *H10B 41/27* (2023.02); *H10B 43/27* (2023.02); *H01L 2224/08145* (2013.01); *H01L 2224/80895* (2013.01); *H01L 2224/80896* (2013.01); *H01L 2924/1431* (2013.01); *H01L 2924/14511* (2013.01); *H01L 2924/3511* (2013.01)

(58) Field of Classification Search
  CPC ...... H10B 63/34; H10B 63/845; H10B 41/27; H01L 23/5226; H01L 21/76805; H01L 21/76816; H01L 21/76831; H01L 21/76879; H01L 2224/08145; H01L 2224/48091; H01L 2224/80006; H01L 2224/8083; H01L 2224/80895; H01L 2224/80896; H01L 2225/06548; H01L 23/5286; H01L 24/08; H01L 24/80; H01L 25/0657; H01L 25/18; H01L 25/50; H01L 2924/00014; H01L 2924/1431; H01L 2924/14511; H10N 70/24; H10N 70/823; H10N 70/8833
  See application file for complete search history.

(56) References Cited

U.S. PATENT DOCUMENTS

| | | | |
|---|---|---|---|
| 9,455,267 B2 | 9/2016 | Zhang et al. | |
| 9,698,223 B2 | 7/2017 | Sharangpani et al. | |
| 9,768,192 B1 | 9/2017 | Nakamura | |
| 9,780,034 B1 | 10/2017 | Tsutsumi et al. | |
| 9,799,671 B2 | 10/2017 | Pachamuthu et al. | |
| 9,887,207 B2 | 2/2018 | Zhang et al. | |
| 9,917,093 B2 | 3/2018 | Chu et al. | |
| 10,103,161 B2 | 10/2018 | Ito et al. | |
| 10,242,994 B2 | 3/2019 | Inomata et al. | |
| 10,355,012 B2 | 7/2019 | Shimabukuro et al. | |
| 10,658,381 B1 | 5/2020 | Yu et al. | |
| 10,665,580 B1* | 5/2020 | Hosoda | H10B 43/10 |
| 10,748,925 B1* | 8/2020 | Tsutsumi | H10B 41/41 |
| 10,790,296 B1 | 9/2020 | Yamaha et al. | |
| 10,804,197 B1 | 10/2020 | Kawasaki et al. | |
| 10,847,408 B2 | 11/2020 | Makala et al. | |
| 10,854,513 B2 | 12/2020 | Kawasaki et al. | |
| 10,854,573 B2 | 12/2020 | Ji et al. | |
| 10,903,222 B2* | 1/2021 | Sakakibara | H01L 23/5283 |
| 10,903,237 B1* | 1/2021 | Hosoda | H01L 23/5283 |
| 10,923,498 B2* | 2/2021 | Otsu | H10B 43/35 |
| 10,964,715 B2* | 3/2021 | Kakazu | H10B 43/27 |
| 11,069,631 B2 | 7/2021 | Onuma | |
| 11,114,406 B2 | 9/2021 | Kanakamedala et al. | |
| 11,109,562 B2 | 12/2021 | Li et al. | |
| 11,367,733 B1* | 6/2022 | Hosoda | H01L 23/5226 |
| 11,417,621 B2* | 8/2022 | Hosoda | H01L 24/08 |
| 11,430,813 B2* | 8/2022 | Prasad | H10B 51/30 |
| 11,502,104 B2* | 11/2022 | Prasad | H10B 51/30 |
| 2015/0206845 A1 | 7/2015 | Lin et al. | |
| 2016/0049421 A1 | 2/2016 | Zhang et al. | |
| 2016/0086969 A1 | 3/2016 | Zhang et al. | |
| 2016/0141419 A1 | 5/2016 | Baenninger et al. | |
| 2016/0149002 A1 | 5/2016 | Sharangpani et al. | |
| 2016/0300848 A1 | 10/2016 | Pachamuthu et al. | |
| 2017/0271261 A1 | 9/2017 | Tsutsumi et al. | |
| 2017/0271352 A1 | 9/2017 | Nakamura | |
| 2017/0373078 A1 | 12/2017 | Chu et al. | |
| 2017/0373087 A1 | 12/2017 | Ito et al. | |
| 2018/0006049 A1 | 1/2018 | Inomata et al. | |
| 2018/0350879 A1 | 12/2018 | Sel et al. | |
| 2018/0374865 A1 | 12/2018 | Shimabukuro et al. | |
| 2020/0251479 A1* | 8/2020 | Sakakibara | H01L 21/76895 |
| 2020/0251485 A1* | 8/2020 | Kakazu | H01L 23/5226 |
| 2020/0251486 A1* | 8/2020 | Tsutsumi | H10B 41/10 |
| 2020/0258817 A1* | 8/2020 | Okina | H10B 43/40 |
| 2020/0266146 A1* | 8/2020 | Nishida | H01L 23/5383 |
| 2020/0286875 A1* | 9/2020 | Nishida | H01L 25/50 |
| 2020/0343258 A1* | 10/2020 | Otsu | H10B 41/35 |
| 2020/0388626 A1* | 12/2020 | Baraskar | H01L 21/823418 |
| 2021/0050371 A1* | 2/2021 | Sharangpani | H10B 51/40 |
| 2021/0066348 A1* | 3/2021 | Prasad | H01L 21/02189 |
| 2021/0074727 A1* | 3/2021 | Prasad | H01L 29/78391 |
| 2021/0104472 A1* | 4/2021 | Shimamoto | H10B 43/35 |
| 2021/0272912 A1 | 9/2021 | Wu et al. | |
| 2021/0388500 A1 | 12/2021 | Shimabukuro et al. | |
| 2021/0388502 A1 | 12/2021 | Shimabukuro et al. | |
| 2021/0408033 A1* | 12/2021 | Baraskar | H01L 25/0657 |
| 2022/0181283 A1* | 6/2022 | Hosoda | H01L 25/50 |
| 2022/0181343 A1* | 6/2022 | Hosoda | H01L 23/5226 |

OTHER PUBLICATIONS

Endoh, T. et al., "Novel Ultra High Density Memory with a Stacked-Surrounding Gate Transistor (S-SGT) Structured Cell," IEDM Proc., (2001), 33-36.

* cited by examiner

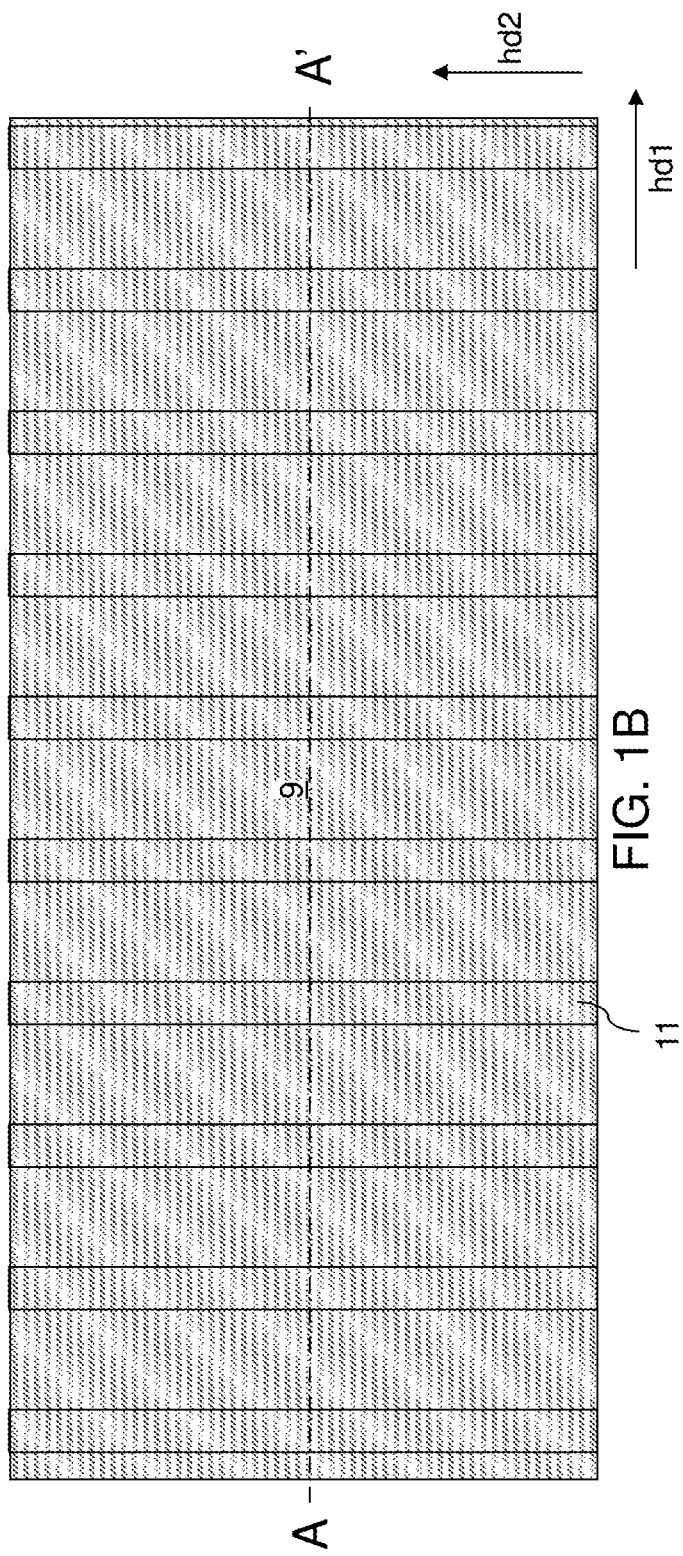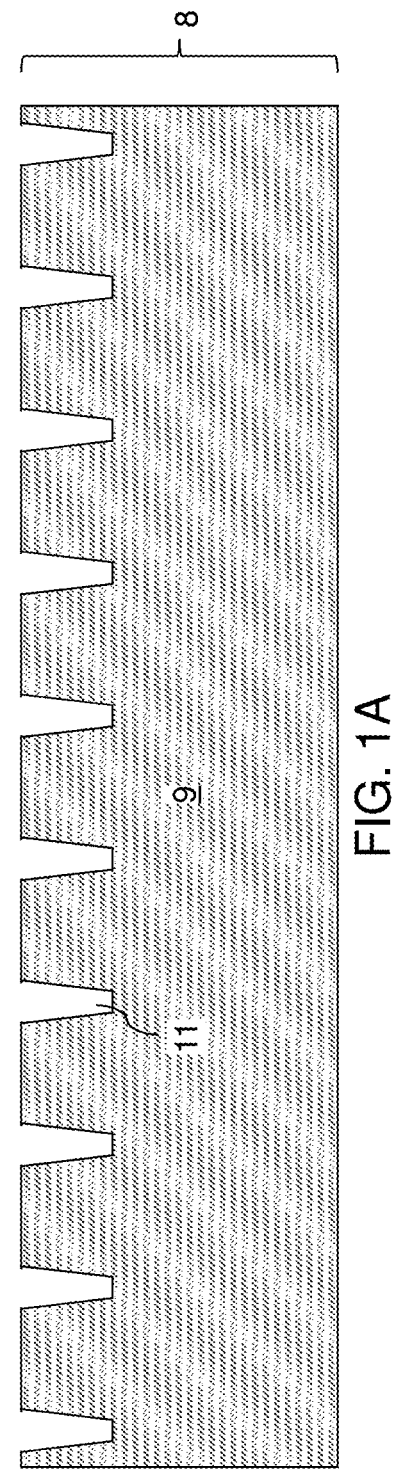

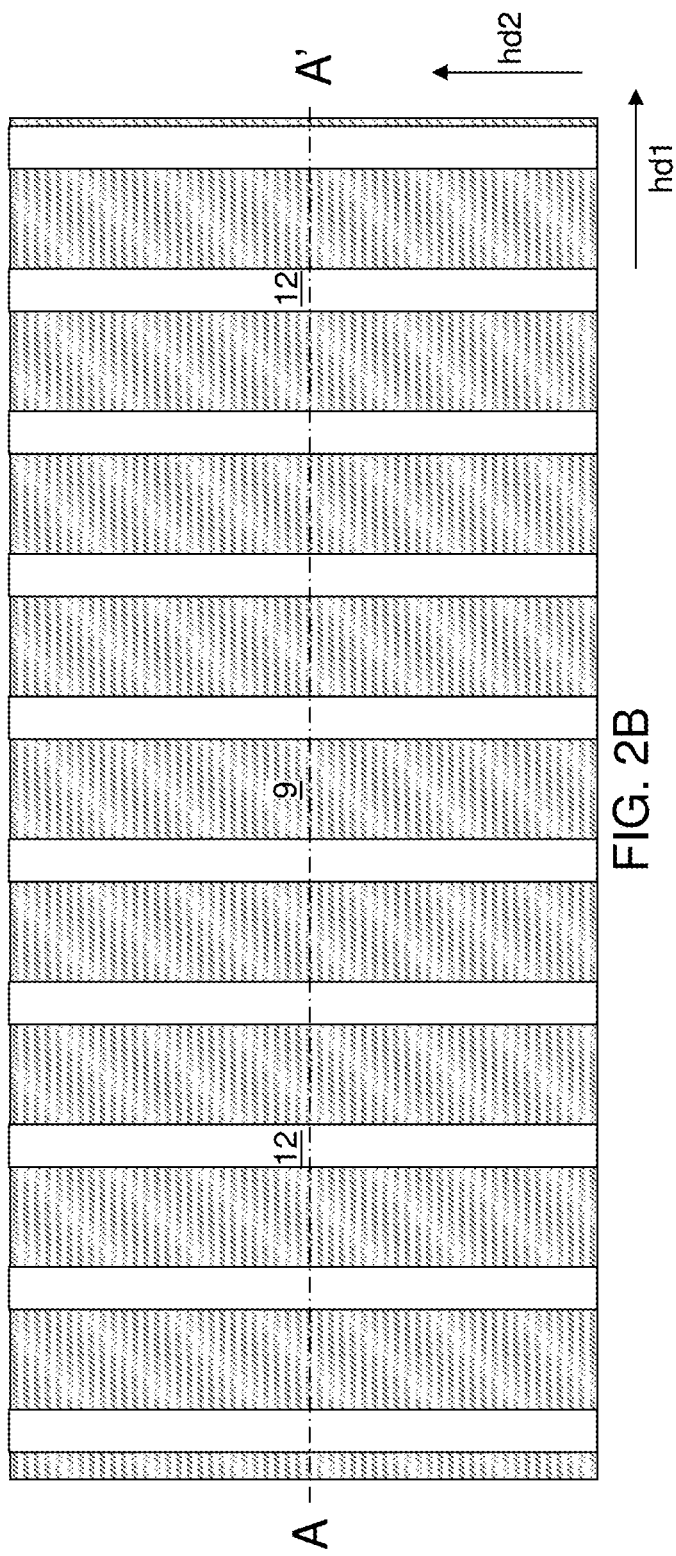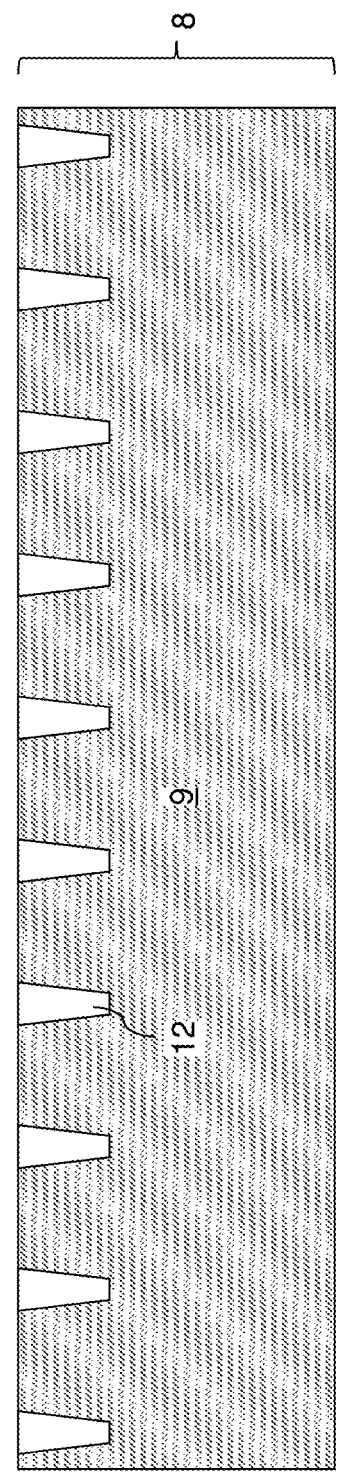

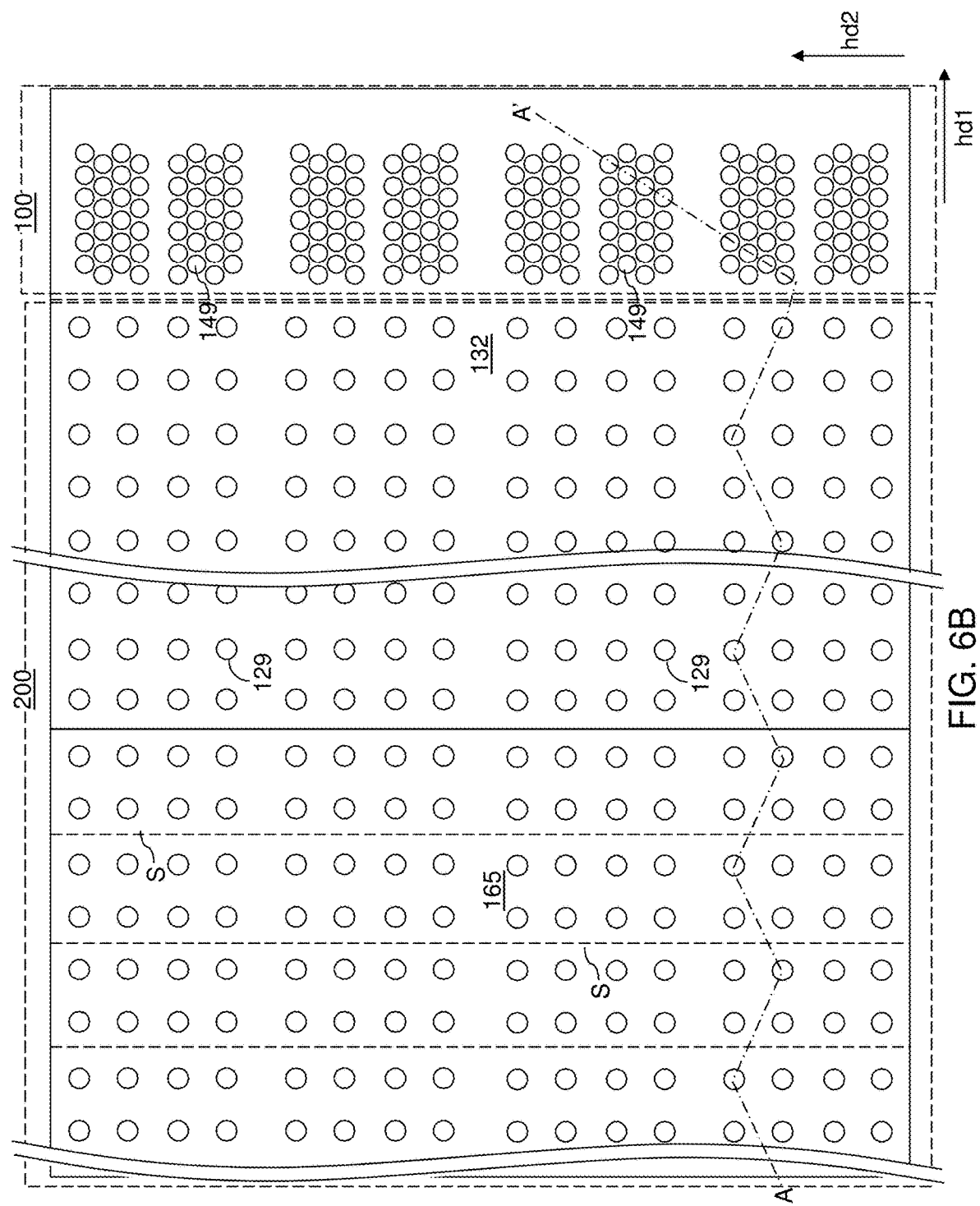

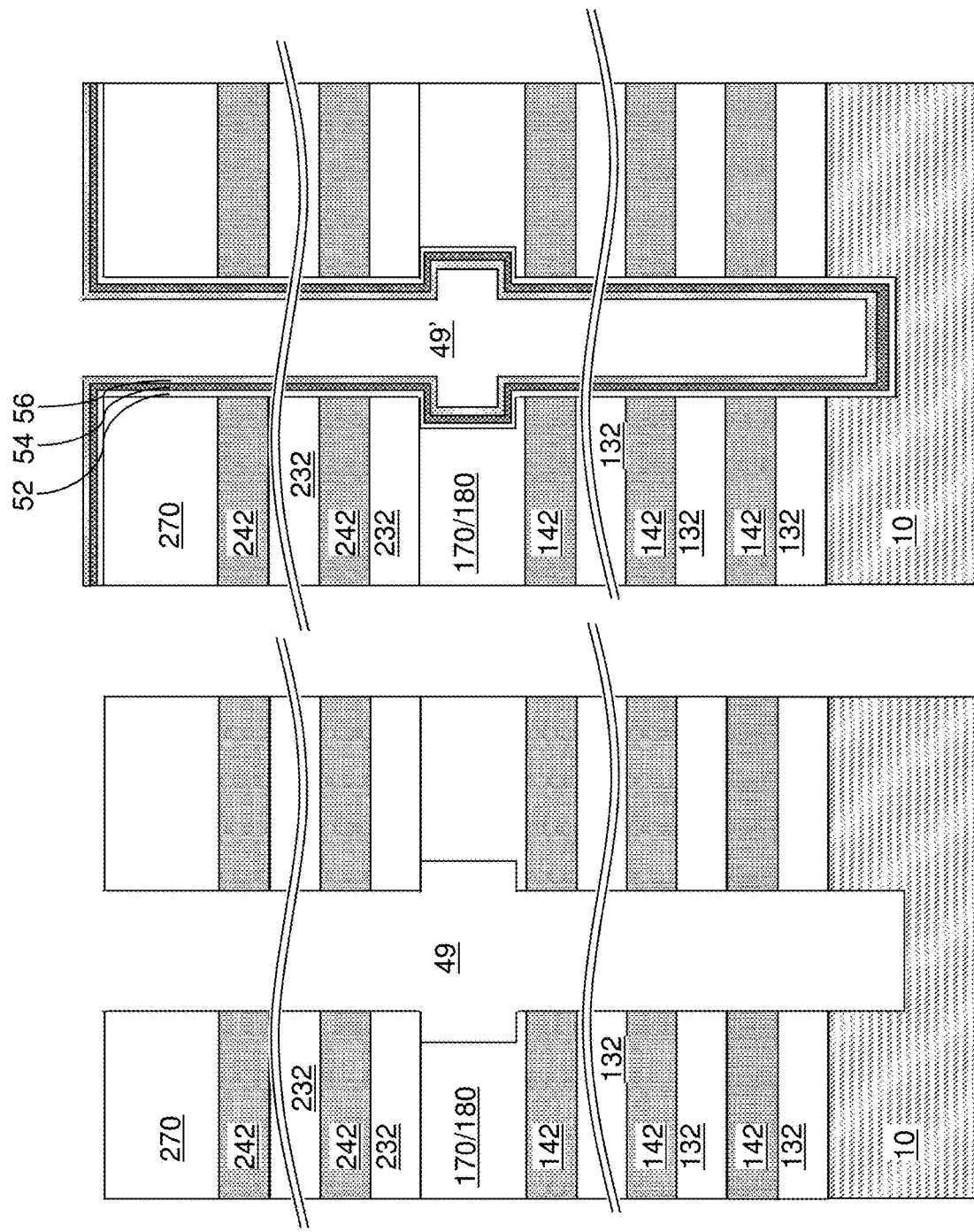

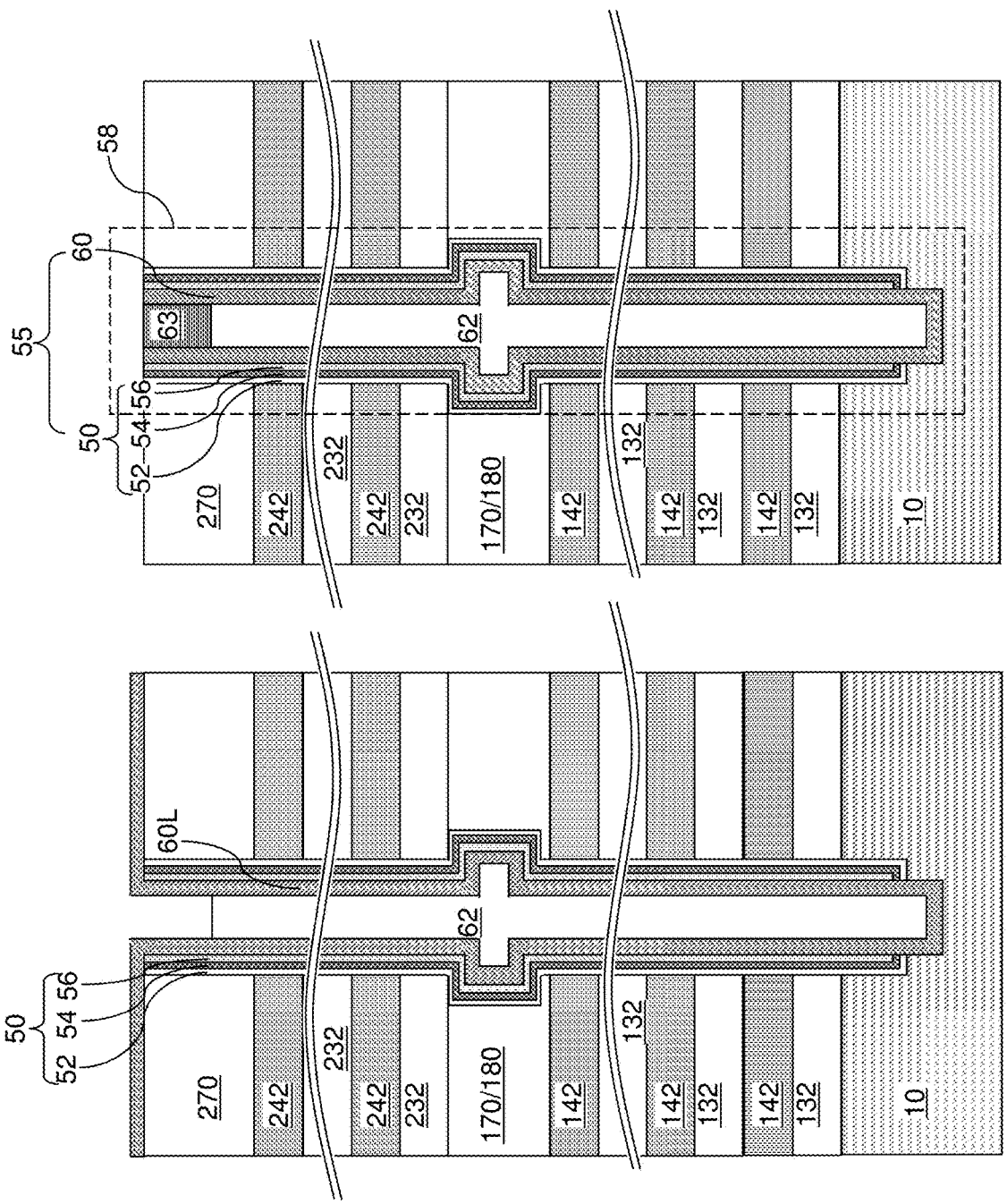

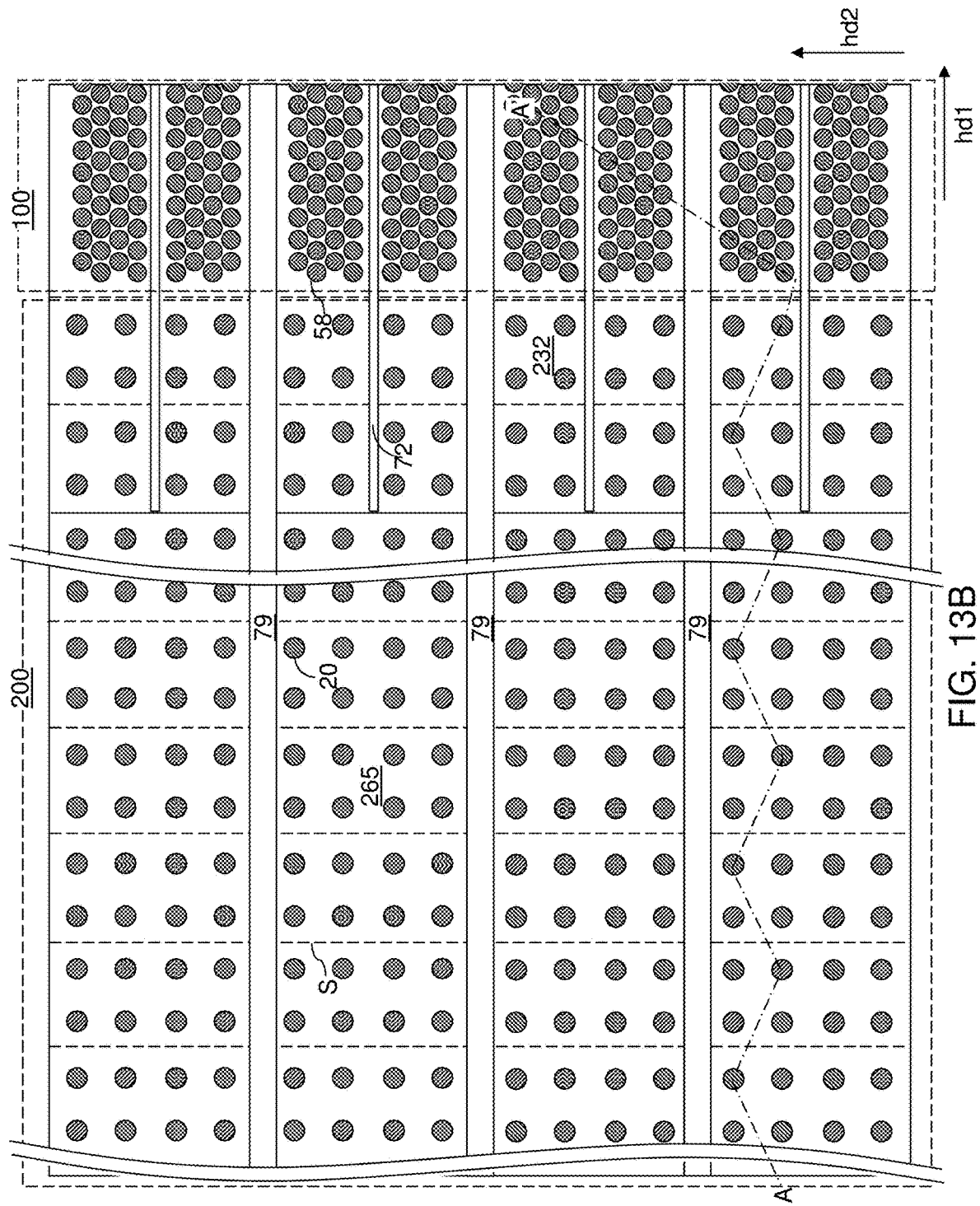

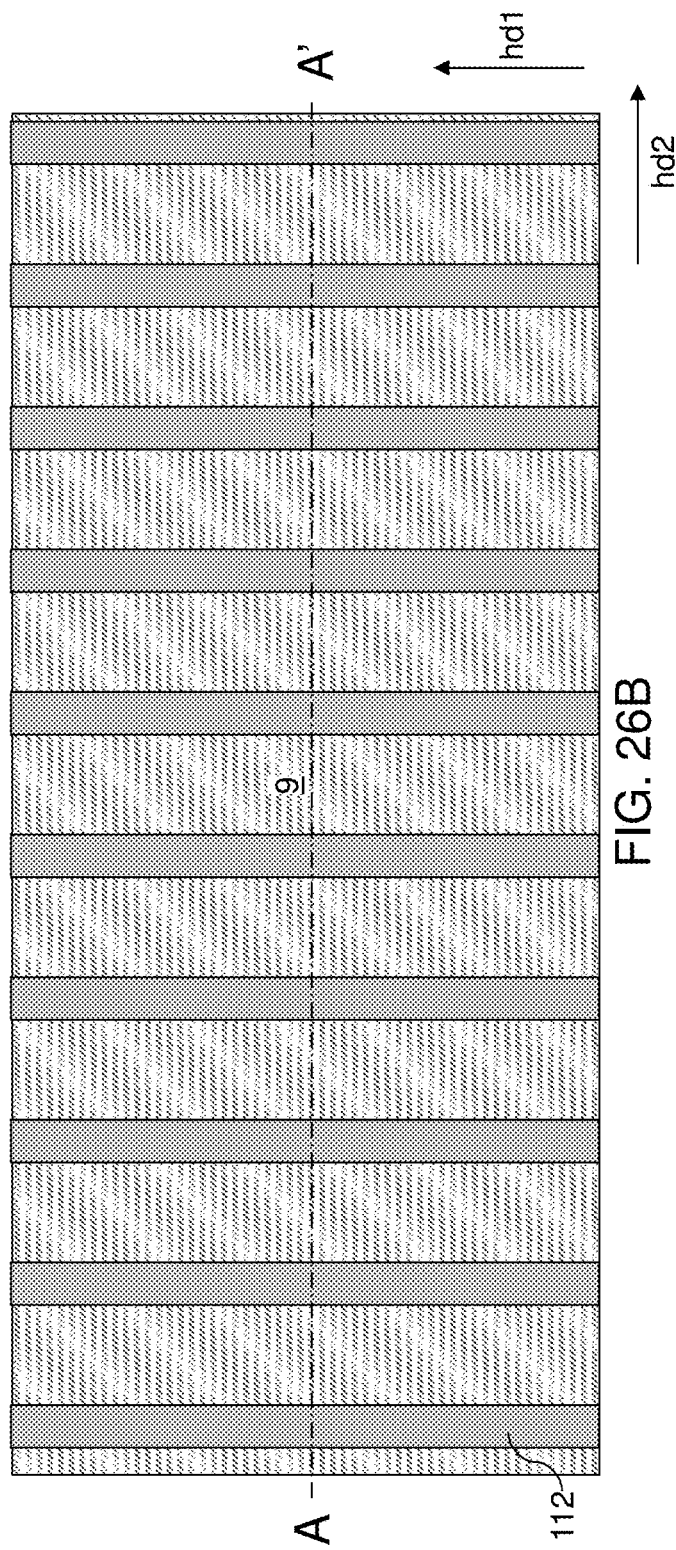
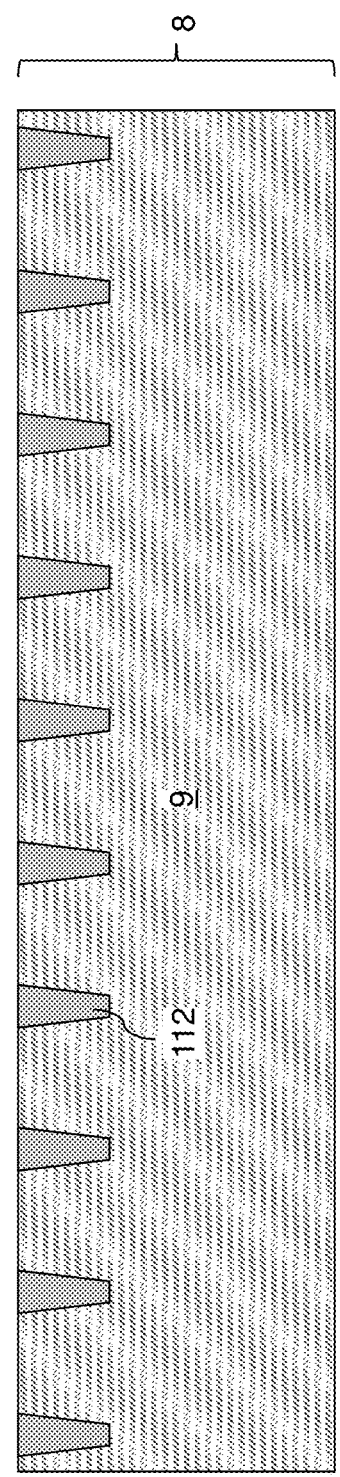

THREE-DIMENSIONAL MEMORY DEVICE INCLUDING DIELECTRIC RAILS FOR WARPAGE REDUCTION AND METHOD OF MAKING THE SAME

FIELD

The present disclosure relates generally to the field of semiconductor devices, and particularly to a three-dimensional memory device including dielectric rails for warpage reduction and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure comprising a memory die is provided. The memory die comprises: dielectric isolation rails embedded within a substrate semiconductor layer; alternating stacks of insulating layers and electrically conductive layers located over the substrate semiconductor layer, wherein the alternating stacks are laterally spaced apart along the second horizontal direction by line trenches that laterally extend along the first horizontal direction; and arrays of memory stack structures vertically extending through the alternating stacks, wherein each of the memory stack structures comprises a respective vertical stack of memory elements and a respective vertical semiconductor channel.

According to another aspect of the present disclosure, a method of forming a semiconductor structure is provided. The method comprises: forming dielectric isolation rails within a front side of a semiconductor substrate; forming alternating stacks of insulating layers and electrically conductive layers over the front side of the semiconductor substrate, wherein the alternating stacks are laterally spaced apart along a second horizontal direction by line trenches that laterally extend along a first horizontal direction; forming arrays of memory stack structures which vertically extend through the alternating stacks, wherein each of the memory stack structures comprises a respective vertical stack of memory elements and a respective vertical semiconductor channel; and forming line trench fill structures in the line trenches.

BRIEF DESCRIPTION OF THE DRAWINGS

FIG. 1A is a vertical cross-sectional view of an exemplary structure after formation of substrate line trenches in a semiconductor substrate according to an embodiment of the present disclosure.

FIG. 1B is a top-down view of the exemplary structure of FIG. 1A. The vertical plane A-A' is the plane of the vertical cross-sectional view of FIG. 1A.

FIG. 2A is a vertical cross-sectional view of the exemplary structure after formation of dielectric isolation rails in the substrate line trenches according to an embodiment of the present disclosure.

FIG. 2B is a top-down view of the exemplary structure of FIG. 2A. The vertical plane A-A' is the plane of the vertical cross-sectional view of FIG. 2A.

FIG. 6B is a horizontal cross-sectional view of the exemplary structure along the horizontal plane B-B' of FIG. 6A. The hinged vertical plane A-A' corresponds to the plane of the vertical cross-sectional view of FIG. 6A.

FIGS. 11A-11D illustrate sequential vertical cross-sectional views of a memory opening during formation of a memory opening fill structure according to an embodiment of the present disclosure.

FIG. 13B is a horizontal cross-sectional view of the exemplary structure along the horizontal plane B-B' of FIG. 13A. The hinged vertical plane A-A' corresponds to the plane of the vertical cross-sectional view of FIG. 13A.

FIG. 26A is a vertical cross-sectional view of an alternative exemplary structure after formation of alternative dielectric isolation rails in the substrate line trenches according to an alternative embodiment of the present disclosure.

FIG. 26B is a top-down view of the exemplary structure of FIG. 26A. The vertical plane A-A' is the plane of the vertical cross-sectional view of FIG. 26A.

DETAILED DESCRIPTION

Figure 3:
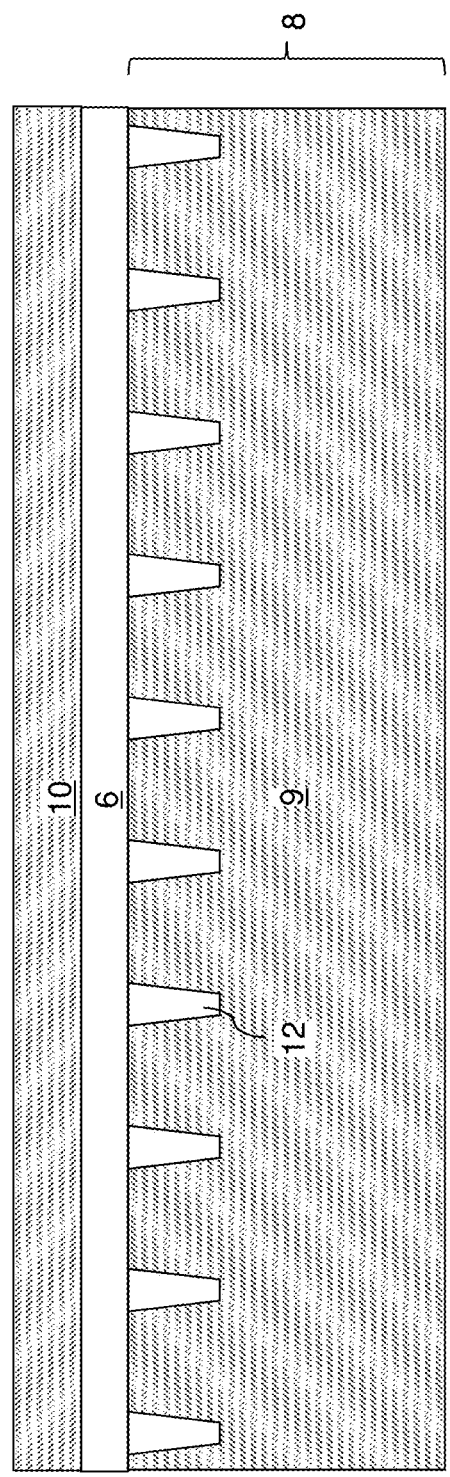
FIG. 3 is a vertical cross-sectional view the exemplary structure after formation of an insulating material layer and a semiconductor material layer according to an embodiment of the present disclosure.
Figure 4:
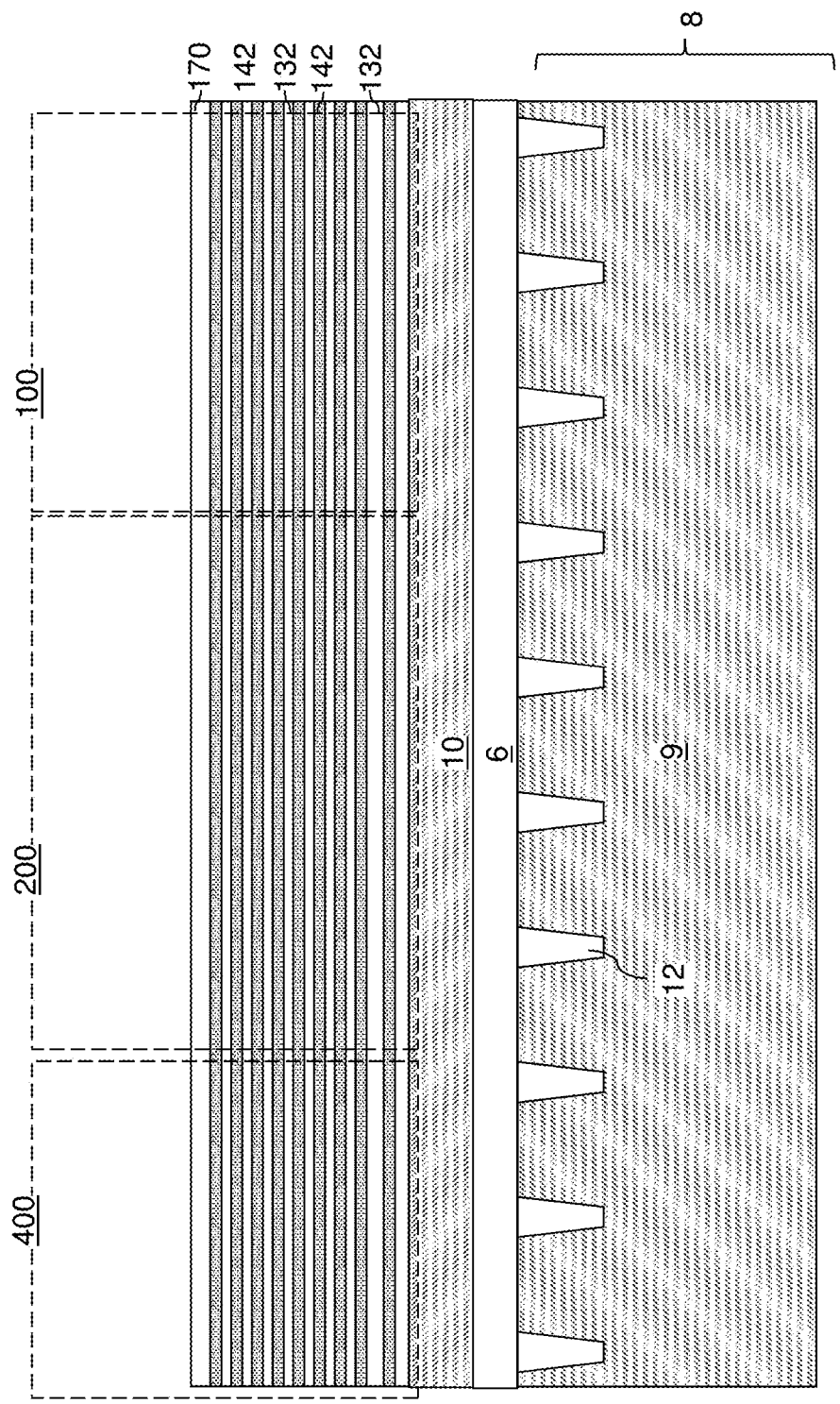
FIG. 4 is a vertical cross-sectional view of the exemplary structure after formation of a first-tier alternating stack of first insulting layers and first spacer material layers according to an embodiment of the present disclosure.

As discussed above, embodiments of the present disclosure are directed to a three-dimensional memory device including dielectric rails for warpage reduction and methods of manufacturing the same, the various aspects of which are described herein in detail. The embodiments of the present disclosure may be used to form various semiconductor devices such as three-dimensional memory array devices comprising a plurality of NAND memory strings. The drawings are not drawn to scale.

Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m.

As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein.

Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A and 1B, an exemplary structure according to an embodiment of the present disclosure comprises a substrate 8 that includes a substrate semiconductor layer 9. The substrate 8 may comprise a commercially available single crystalline silicon wafer having a thickness in a range from 300 microns to 1 mm, and the substrate semiconductor layer 9 may comprise a doped well in the substrate 8, an upper surface of the substrate 8 and/or an epitaxial (e.g., single crystalline) silicon layer formed on the top surface of the substrate 8.

According to an aspect of the present disclosure, line trenches are formed in an upper portion of the substrate semiconductor layer 9 (e.g., in the top of the substrate 8). The line trenches are herein referred to as substrate line trenches 11. The substrate line trenches 11 may be laterally spaced apart from each other along a first horizontal direction hd1, and may laterally extend along a second horizontal direction hd2 that is perpendicular to the first horizontal direction hd1. In one embodiment, the substrate line trenches 11 can be formed by applying and patterning a photoresist layer over the top surface of the substrate semiconductor layer 9 such that the patterned photoresist layer includes line-shaped openings that laterally extend along the second horizontal direction hd2 and laterally spaced apart along the first horizontal direction hd1, and by transferring the pattern in the photoresist layer into an upper portion of the substrate semiconductor layer 9 by performing an anisotropic etch process. Unmasked portions of the substrate semiconductor layer 9 are etched by the anisotropic etch process, and the substrate line trenches 11 are formed. Each substrate line trench 11 may have a vertical cross-sectional profile within a vertical plane that is perpendicular to the second horizontal direction hd2. The vertical cross-sectional profile of each substrate line trench 11 may be invariant with translation along the second horizontal direction hd2.

In one embodiment, the depth of each substrate line trench 11 may be in a range from 100 nm to 8,000 nm, such as from 900 nm to 2,000 nm, although lesser and greater depths may also be employed. The maximum width of each substrate line trench 11, as measured at the top of each substrate line trench 11, may be in a range from 200 nm to 4,000 nm, such as from 400 nm to 2,000 nm, although lesser and greater widths may also be employed. The minimum width of each substrate line trench 11, as measured at the bottom of each substrate line trench 11, may be in a range from 10 nm to 3,600 nm, such as from 20 nm to 1,800 nm, although lesser and greater widths may also be employed. Each of the substrate line trenches 11 may comprise tapered lengthwise sidewalls that vertically extend from the top surface of the substrate semiconductor layer 9 to a bottom surface of the respective substrate line trench 11 and laterally extend along the second horizontal direction hd2. The tapered lengthwise sidewalls of the substrate line trenches 11 may have a taper angle with respect to a vertical plane that is perpendicular to the first horizontal direction hd1. The taper angle may be in a range from 1 degree to 15 degrees, such as from 2 degrees to 10 degrees, although lesser and greater taper angles may also be employed.

In one embodiment, the substrate line trenches 11 may be formed as a periodic structure having a uniform pitch along the first horizontal direction hd1. The uniform pitch may be in a range from 200 nm to 20,000 nm, such as from 400 nm to 10,000 nm, although lesser and greater uniform pitches may also be employed. Generally, each substrate line trench 11 may be formed as a void of a significant size relative to memory openings to be subsequently formed. For example, the maximum width of each substrate line trench 11 may be at least 4 times the maximum lateral dimension of each memory opening to be subsequently formed. The photoresist layer may be subsequently removed, for example, by ashing.

Referring to FIGS. 2A and 2B, dielectric fill material such as undoped silicate glass (i.e., silicon oxide) or a doped silicate glass can be deposited in the substrate line trenches 11 by a conformal deposition process. For example, a chemical vapor deposition process may be performed to deposit the dielectric fill material in the substrate line trenches 11. Optionally, a reflow process may be performed to enhance the gap fill characteristics of the dielectric fill material in the substrate line trenches 11. A planarization process such as a chemical mechanical polishing process may be performed to remove portions of the dielectric fill material deposited above the horizontal plane including the top surface of the substrate semiconductor layer 9. Each remaining portion of the dielectric fill material constitutes a dielectric isolation rail 12.

The dielectric isolation rails 12 are formed within and upper portion of the substrate semiconductor layer 9. The dielectric isolation rails 12 are laterally spaced apart along the first horizontal direction hd1, and each of the dielectric isolation rails 12 laterally extends along the second horizontal direction hd2 that is perpendicular to the first horizontal direction hd1.

In one embodiment, the height of each dielectric isolation rail 12 may be in a range from 100 nm to 8,000 nm, such as from 900 nm to 2,000 nm, although lesser and greater heights may also be employed. The maximum width of each dielectric isolation rail 12, as measured at the top of each dielectric isolation rail 12, may be in a range from 200 nm to 4,000 nm, such as from 400 nm to 2,000 nm, although lesser and greater widths may also be employed. The minimum width of each dielectric isolation rail 12, as measured at the bottom of each dielectric isolation rail 12, may be in a range from 10 nm to 3,600 nm, such as from 20 nm to 1,800 nm, although lesser and greater widths may also be employed. Each of the dielectric isolation rails 12 may comprise tapered lengthwise sidewalls that vertically extend from the top surface of the substrate semiconductor layer 9 to a bottom surface of the respective dielectric isolation rail 12 and laterally extend along the second horizontal direction hd2. The tapered lengthwise sidewalls of the dielectric isolation rails 12 may have a taper angle with respect to a vertical plane that is perpendicular to the first horizontal direction hd1. The taper angle may be in a range from 1 degree to 15 degrees, such as from 2 degrees to 10 degrees, although lesser and greater taper angles may also be employed.

In one embodiment, the dielectric isolation rails 12 may be formed as a periodic structure having a uniform pitch along the first horizontal direction hd1. The uniform pitch may be in a range from 200 nm to 20,000 nm, such as from 400 nm to 10,000 nm, although lesser and greater uniform pitches may also be employed.

Referring to FIG. 3, an optional insulating material layer 6 can be deposited over the top surface of the substrate semiconductor layer 9 and the top surfaces of the dielectric isolation rails 12. The insulating material layer 6 may comprise silicon oxide, silicon nitride, silicon carbide nitride, a dielectric metal oxide (such as aluminum oxide, titanium oxide, lanthanum oxide, etc.), or a stack thereof. The insulating material layer 6 may be deposited, for example, by chemical vapor deposition. The thickness of the insulating material layer 6 may be in a range from 100 nm to 1,000 nm, although lesser and greater thicknesses may also be employed.

An optional semiconductor material layer 10 can be deposited on the insulating material layer 6. The semiconductor material layer 10 comprises a material that can be employed as a horizontal semiconductor channel or a source layer for a three-dimensional memory array to be subsequently formed. In case vertical semiconductor channels to be subsequently formed have a doping of a first conductivity type, the semiconductor material layer 10 may have a doping of the first conductivity type or a second conductivity type that is the opposite of the first conductivity type. Specifically, if the semiconductor material layer 10 is employed as a horizontal semiconductor channel, the semiconductor material layer 10 has a doping of the first conductivity type. If the semiconductor material layer 10 is employed as a source layer, the semiconductor material layer 10 has a doping of the second conductivity type. The semiconductor material layer 10 may comprise at least one elemental semiconductor material such as silicon, germanium, or a silicon-germanium alloy, or may comprise a compound semiconductor material such as a III-V compound semiconductor material, a II-VI compound semiconductor material, or an organic semiconductor material. The semiconductor material layer 10 may be deposited by a conformal or non-conformal deposition process. The semiconductor material of the semiconductor material layer 10 may be deposited as a polycrystalline semiconductor material (e.g., polysilicon), or may be deposited as an amorphous semiconductor material and may be subsequently annealed into a polycrystalline semiconductor material. In one embodiment, the semiconductor material layer 10 may be deposited by chemical vapor deposition. The thickness of the semiconductor material layer 10 may be in a range from 100 nm to 1,000 nm, although lesser and greater thicknesses may also be employed.

Alternatively, the semiconductor material layer 10 and the insulating material layer 6 may be omitted. In this case, the horizontal semiconductor channel may be located in the substrate semiconductor layer 9.

Referring to FIG. 3, a first-tier alternating stack of first material layers and second material layers can be formed over the substrate 8 (e.g., over the semiconductor material layer 10 if present). The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the semiconductor material layer 10. As used herein, a "sacrificial material" refers to a material that is removed during a subsequent processing step.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 5:
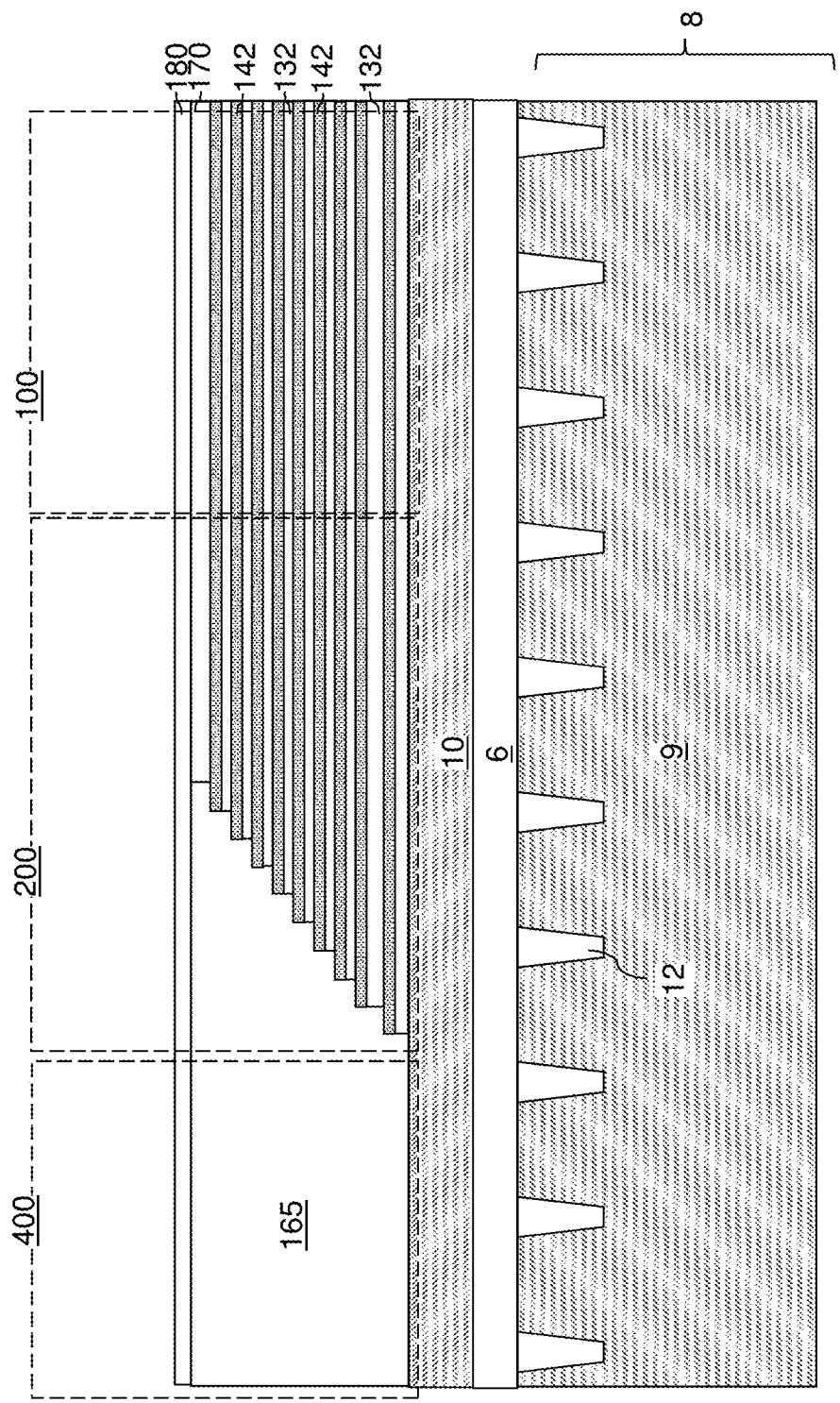
FIG. 5 is a vertical cross-sectional view of the exemplary structure after patterning a first-tier staircase region, a first retro-stepped dielectric material portion, and an inter-tier dielectric layer according to an embodiment of the present disclosure.

Referring to FIG. 5, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a stepped dielectric material portion, which is herein referred to as a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 6A:
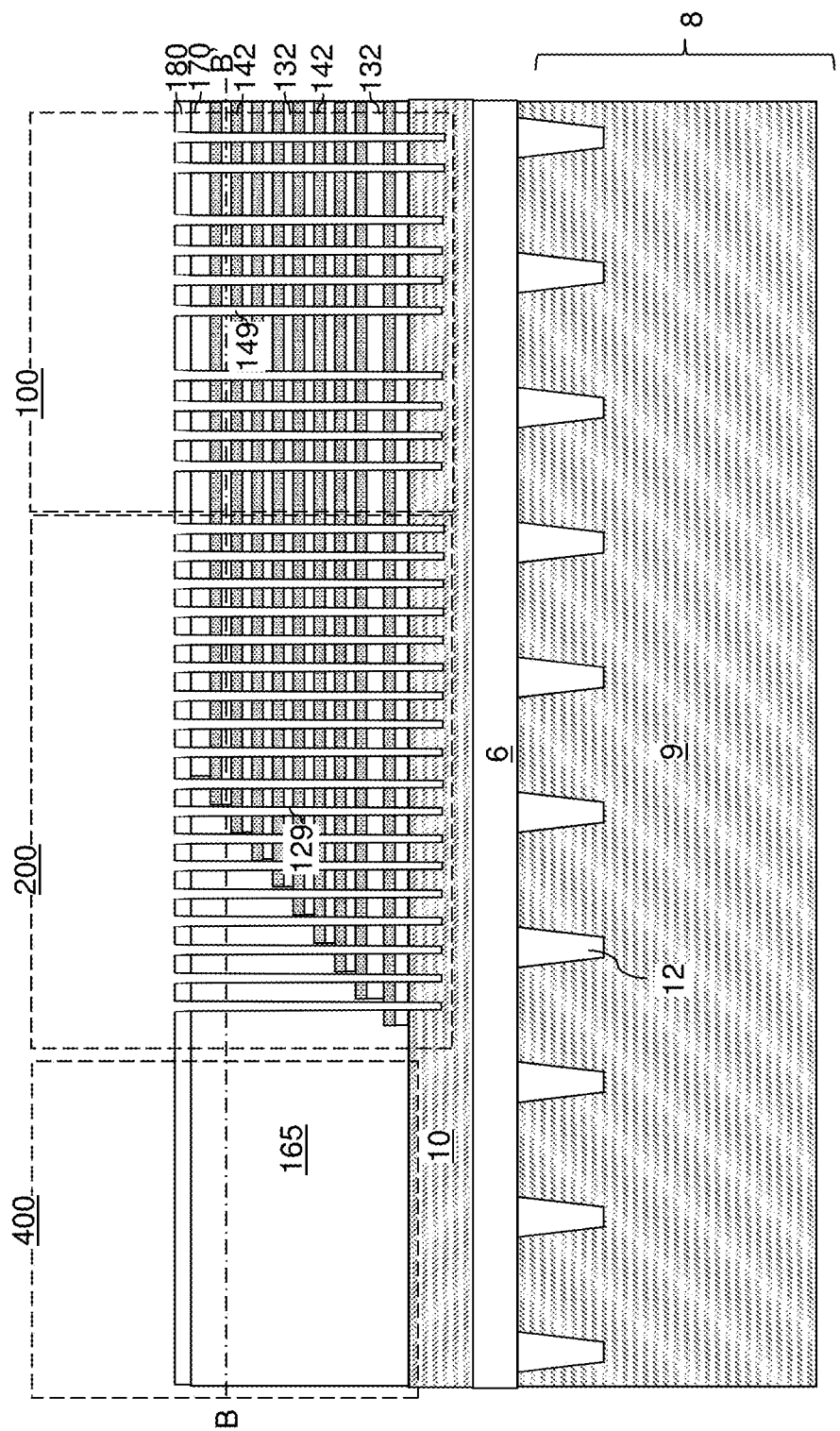
FIG. 6A is a vertical cross-sectional view of the exemplary structure after formation of first-tier memory openings and first-tier support openings according to an embodiment of the present disclosure.

Referring to FIGS. 6A and 6B, various first-tier openings (149, 129) may be formed through the inter-tier dielectric layer 180 and the first-tier structure (132, 142, 170, 165) and into the semiconductor material layer 10. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the semiconductor material layer 10 by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first-tier alternating stack (132, 142) are illustrated as dotted lines in FIG. 6B.

The first-tier memory openings 149 are openings that are formed in the memory array region 100 through each layer within the first-tier alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

Figure 7:
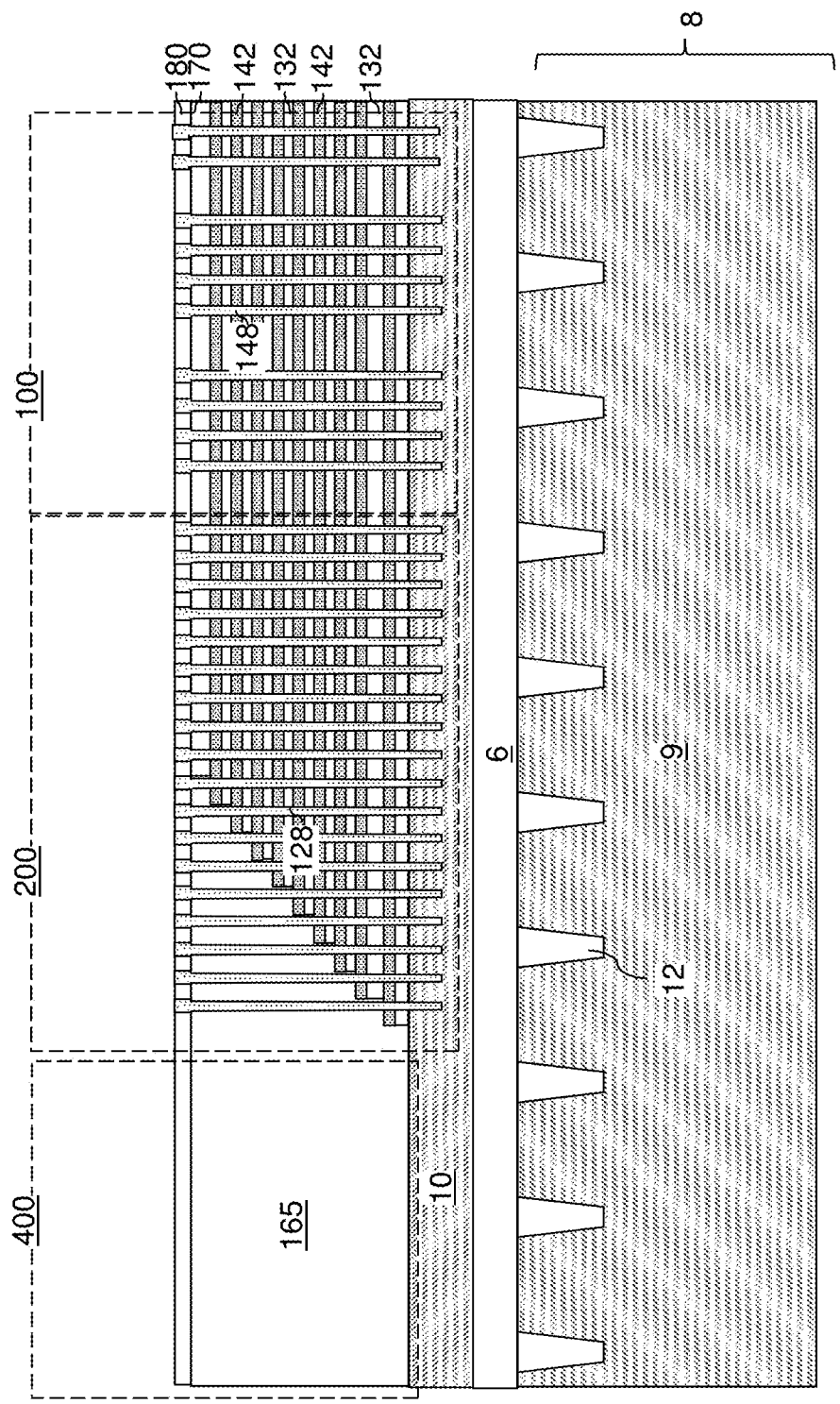
FIG. 7 is a vertical cross-sectional view of the exemplary structure after formation of various sacrificial fill structures according to an embodiment of the present disclosure.

Referring to FIG. 7, sacrificial first-tier opening fill portions (148, 128) may be formed in the various first-tier openings (149, 129). For example, a sacrificial first-tier fill material is concurrently deposited in each of the first-tier openings (149, 129). The sacrificial first-tier fill material includes a material that may be subsequently removed selective to the materials of the first insulating layers 132 and the first sacrificial material layers 142. Portions of the deposited sacrificial material may be removed from above the topmost layer of the first-tier alternating stack (132, 142), such as from above the inter-tier dielectric layer 180. Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128.

Figure 8:
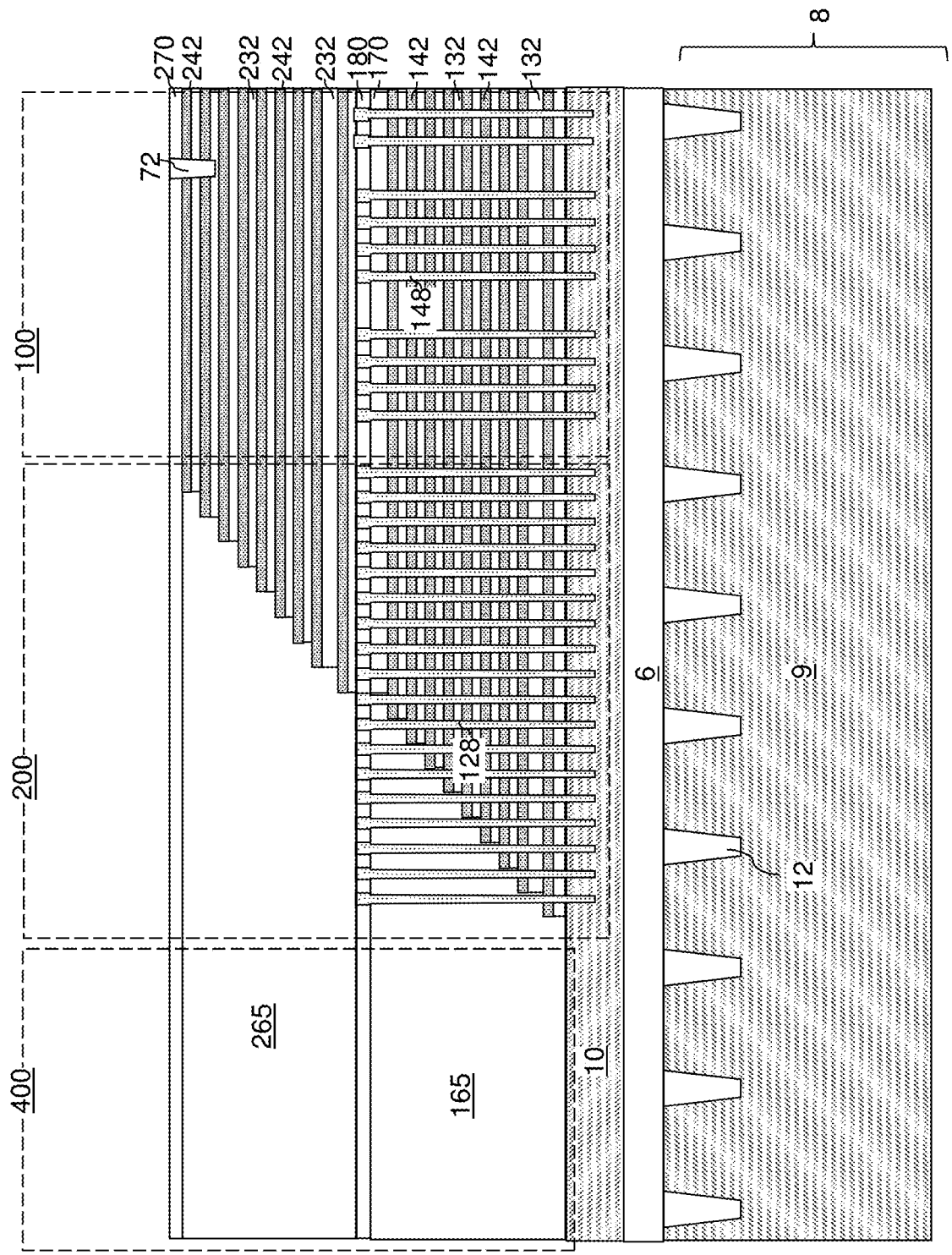
FIG. 8 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 8, a second-tier structure may be formed over the first-tier structure (132, 142, 170, 148). The second-tier structure may include an additional alternating stack of insulating layers and spacer material layers, which may be sacrificial material layers. For example, a second-tier alternating stack (232, 242) of second insulating layers 232 and second sacrificial material layers 242 may be formed. Insulating materials that may be used for the second insulating layers 232 may be any material that may be used for the first insulating layers 132. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A stepped dielectric material portion, which is herein referred to as a second retro-stepped dielectric material portion 265, may be formed over the second stepped surfaces in the staircase region 200.

A second insulating cap layer 270 may be subsequently formed over the second-tier alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second-tier alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 9A:
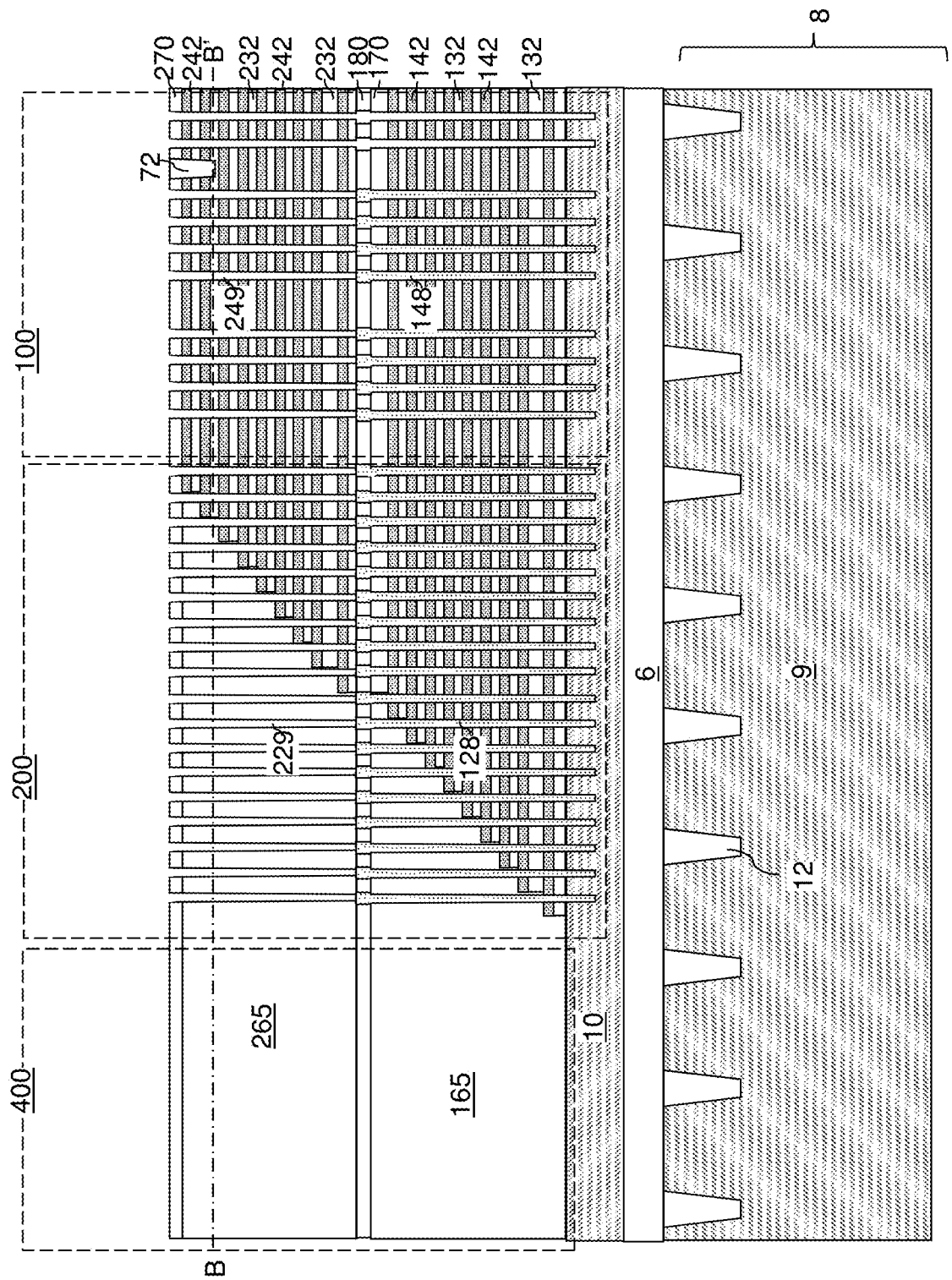
FIG. 9A is a vertical cross-sectional view of the exemplary structure after formation of second-tier memory openings and second-tier support openings according to an embodiment of the present disclosure.
Figure 9B:
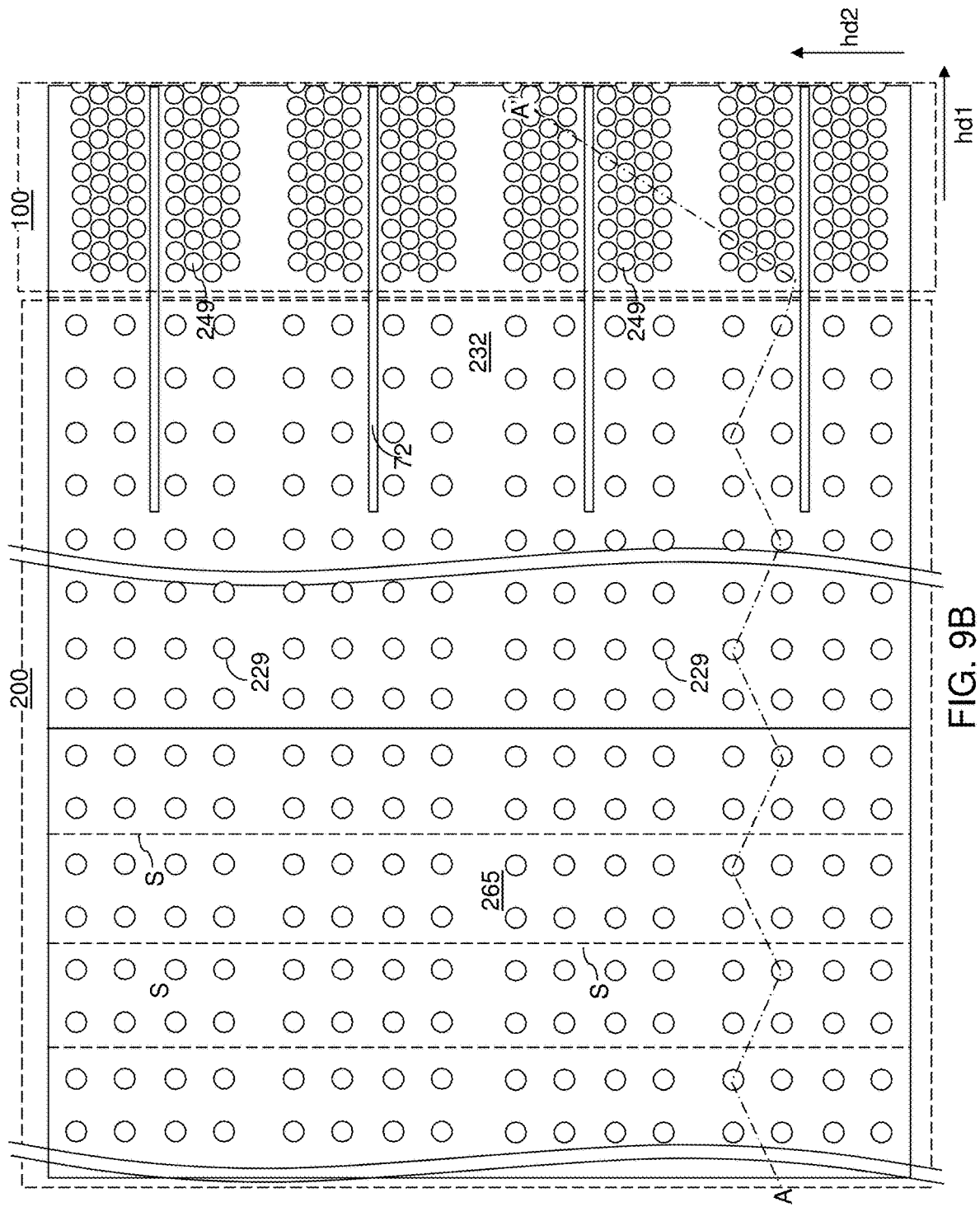
FIG. 9B is a horizontal cross-sectional view of the exemplary structure along the horizontal plane B-B' of FIG. 9A. The hinged vertical plane A-A' corresponds to the plane of the vertical cross-sectional view of FIG. 9A.

Referring to FIGS. 9A and 9B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second-tier alternating stack (232, 242) and the second retro-stepped dielectric material portion 265.

Figure 10:
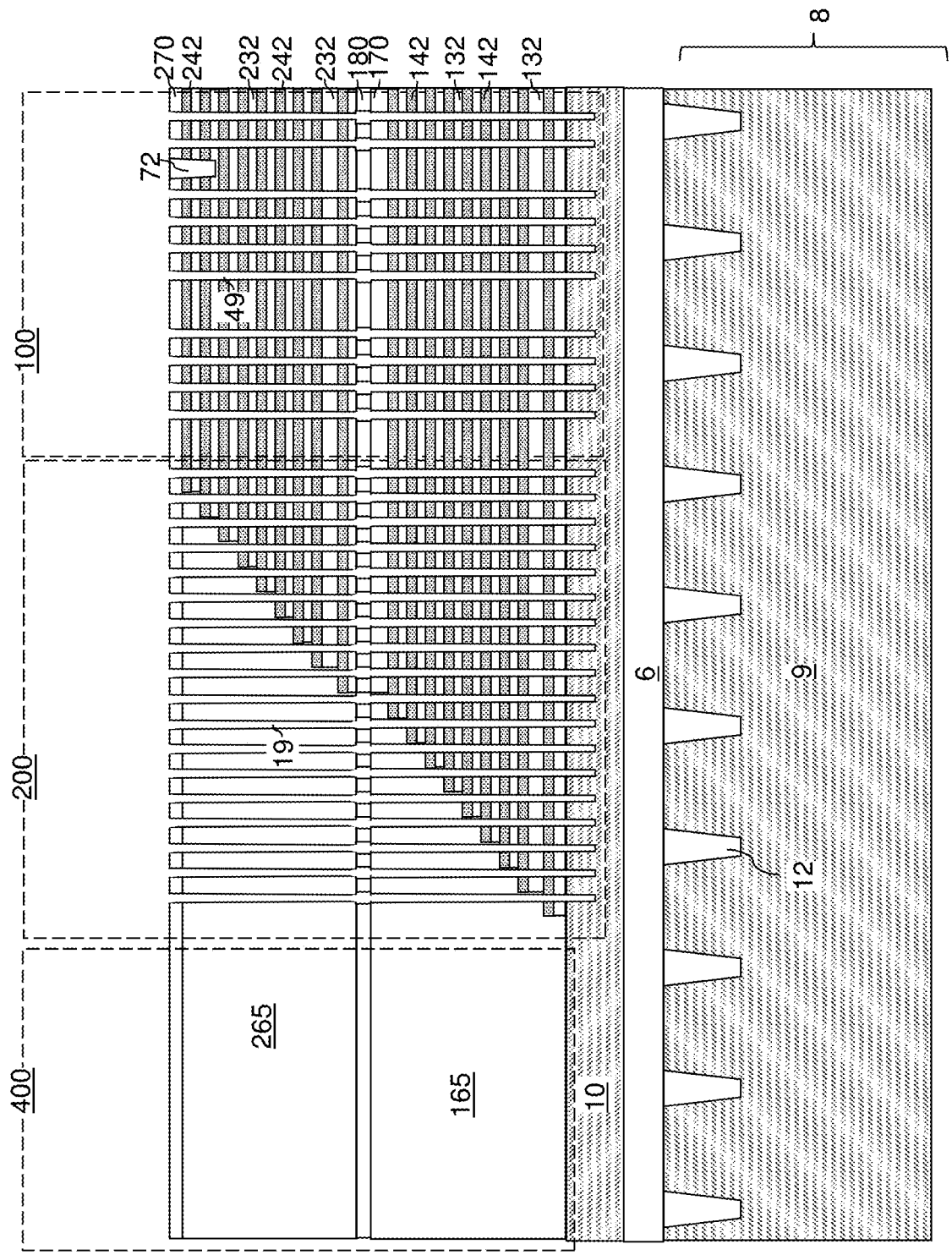
FIG. 10 is a vertical cross-sectional view of the exemplary structure after formation of inter-tier memory openings and inter-tier support openings according to an embodiment of the present disclosure.

Referring to FIG. 10, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 11A-11D provide sequential cross-sectional views of a memory opening 49 during formation of a memory opening fill structure. The same structural change occurs in each of the memory openings 49 and the support openings 19.

Referring to FIG. 11A, a memory opening 49 in the first exemplary device structure of FIG. 10 is illustrated. The memory opening 49 extends through the first-tier structure and the second-tier structure.

Referring to FIG. 11B, a stack of layers including a blocking dielectric layer 52, a memory material layer 54, and a dielectric material liner 56 may be sequentially deposited in the memory openings 49. The memory material layer 54 may include any memory material that can store information therein. In one embodiment, the memory material layer 54 may comprise a charge storage layer that can store electrical charges therein. In this case, the memory material layer 54 may comprise a silicon nitride layer. The dielectric material liner 56 includes a dielectric material. In one embodiment, the dielectric material liner 56 may comprise a tunneling dielectric layer.

Referring to FIG. 11C, an anisotropic etch process can be performed to remove horizontally-extending portions of the dielectric material liner 56, the memory material layer 54, and the blocking dielectric layer 52. Remaining portions of the dielectric material liner 56, the memory material layer 54, and the blocking dielectric layer 52 constitute a memory film 50. A surface of the semiconductor material layer 10 can be physically exposed at the bottom of each memory opening 49. The semiconductor channel material layer 60L includes a semiconductor material having a doping of the first conductivity type, which may be p-type or n-type. A dielectric fill material can be deposited in a remaining volume of the memory opening 49, and may be subsequently vertically recessed to form a dielectric core 62.

Referring to FIG. 11D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material and the semiconductor channel material layer 60L that overlie the horizontal plane including the top surface of the second insulating cap layer 270 may be removed by a planarization process such as a chemical mechanical planarization (CMP) process. A remaining portion of the doped semiconductor material of the second conductivity type constitutes a drain region 63. A remaining portion of the semiconductor channel material layer 60L constitutes a vertical semiconductor channel 60 through which electrical current may flow when a vertical NAND device including the vertical semiconductor channel 60 is turned on.

Each combination of a memory film 50 and a vertical semiconductor channel 60 within a memory opening 49 constitutes a memory stack structure 55. The memory stack structure 55 may comprise a combination of a vertical semiconductor channel 60, a dielectric material liner 56, a plurality of memory elements comprising portions of the memory material layer 54, and an optional blocking dielectric layer 52. Each combination of a memory stack structure 55, a dielectric core 62, and a drain region 63 within a memory opening 49 constitutes a memory opening fill structure 58. The semiconductor material layer 10, the first-tier structure (132, 142, 170, 165), the second-tier structure (232, 242, 270, 265, 72), the inter-tier dielectric layer 180, the memory opening fill structures 58, and support pillar structures that are formed in the support openings 19 collectively constitute a memory-level assembly.

Figure 12A:
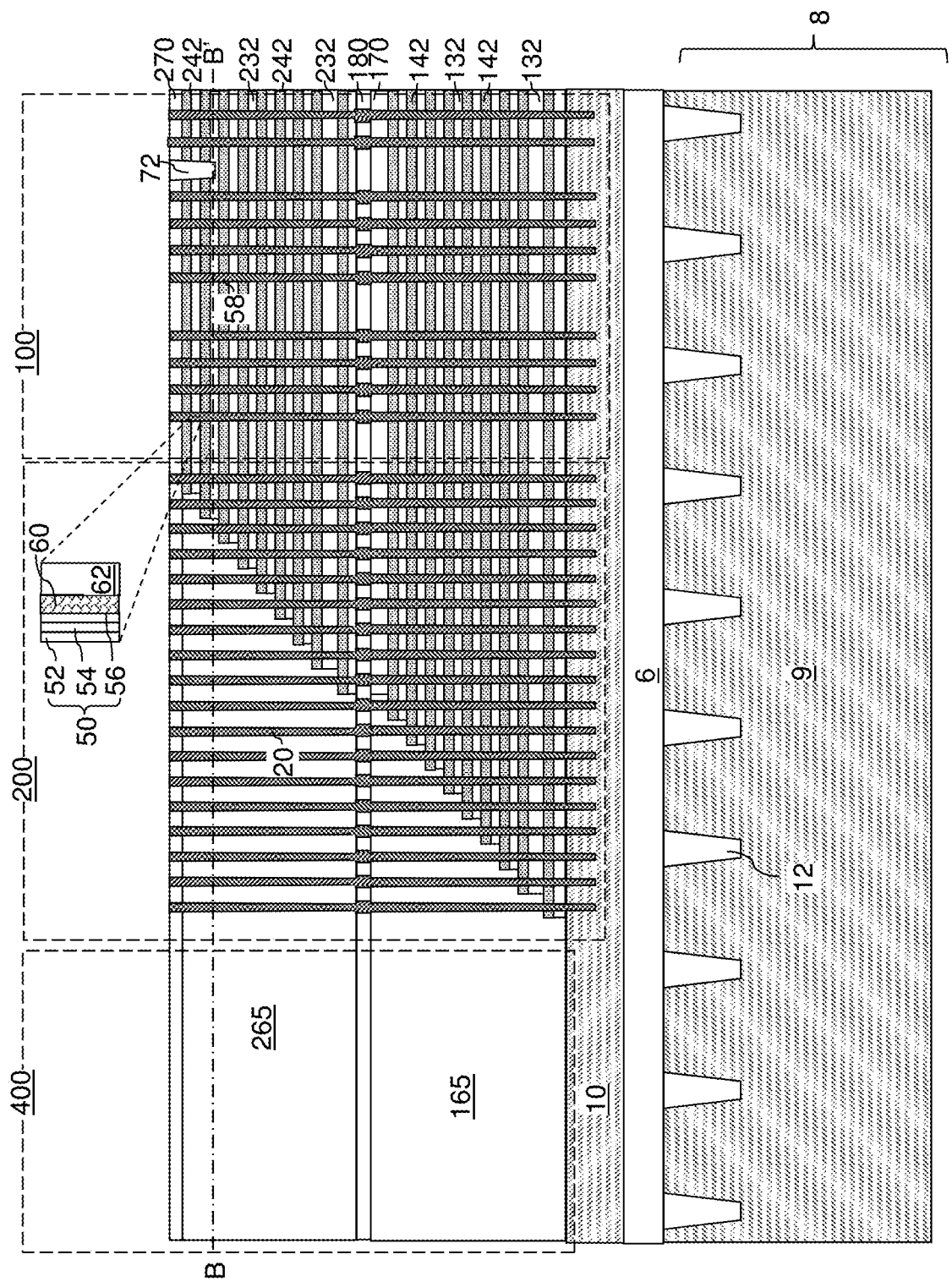
FIG. 12A is a vertical cross-sectional view of the exemplary structure after formation of memory opening fill structures and support pillar structures according to an embodiment of the present disclosure.
Figure 12B:
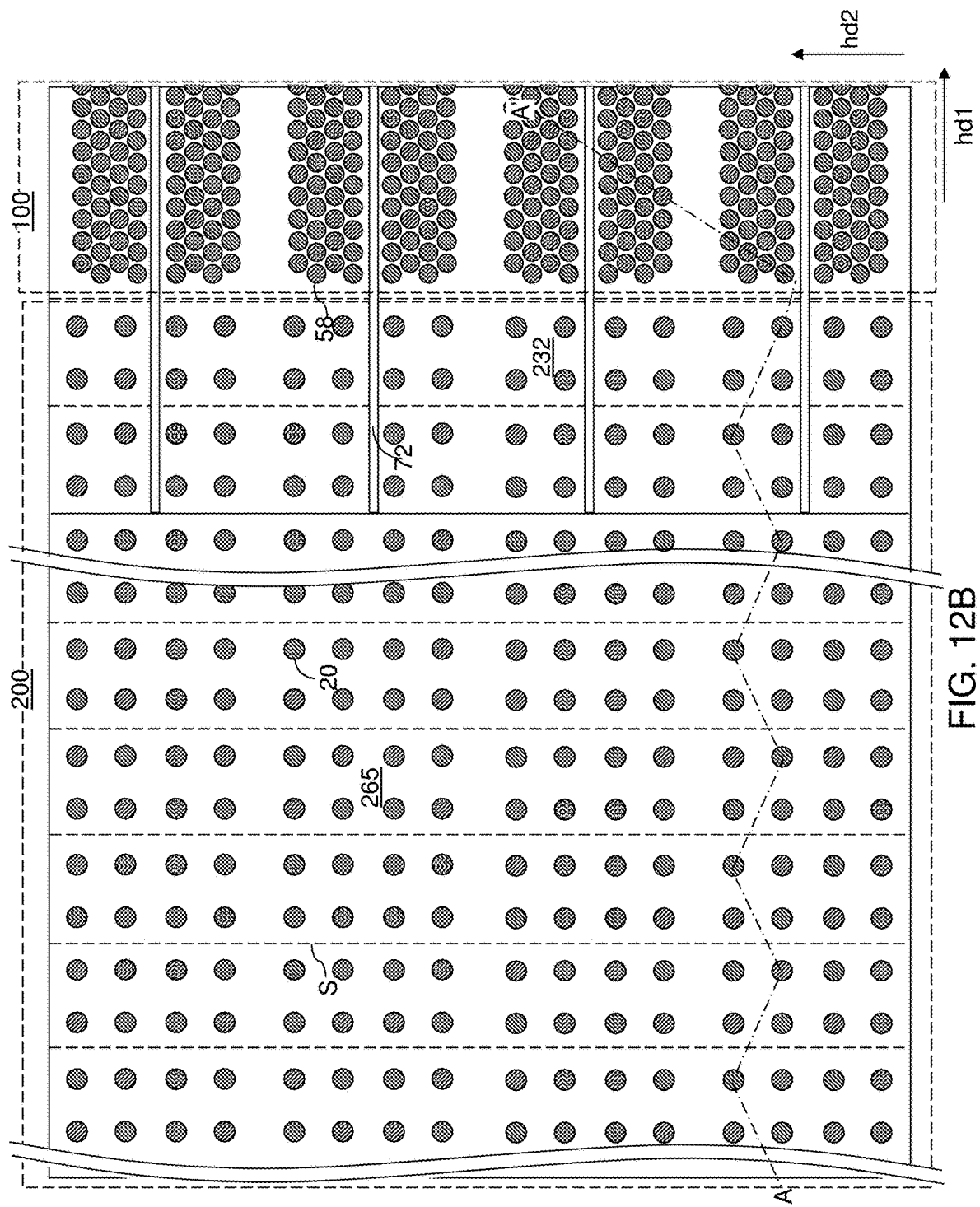
FIG. 12B is a horizontal cross-sectional view of the exemplary structure along the horizontal plane B-B' of FIG. 12A. The hinged vertical plane A-A' corresponds to the plane of the vertical cross-sectional view of FIG. 12A.

Referring to FIGS. 12A and 12B, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 13A:
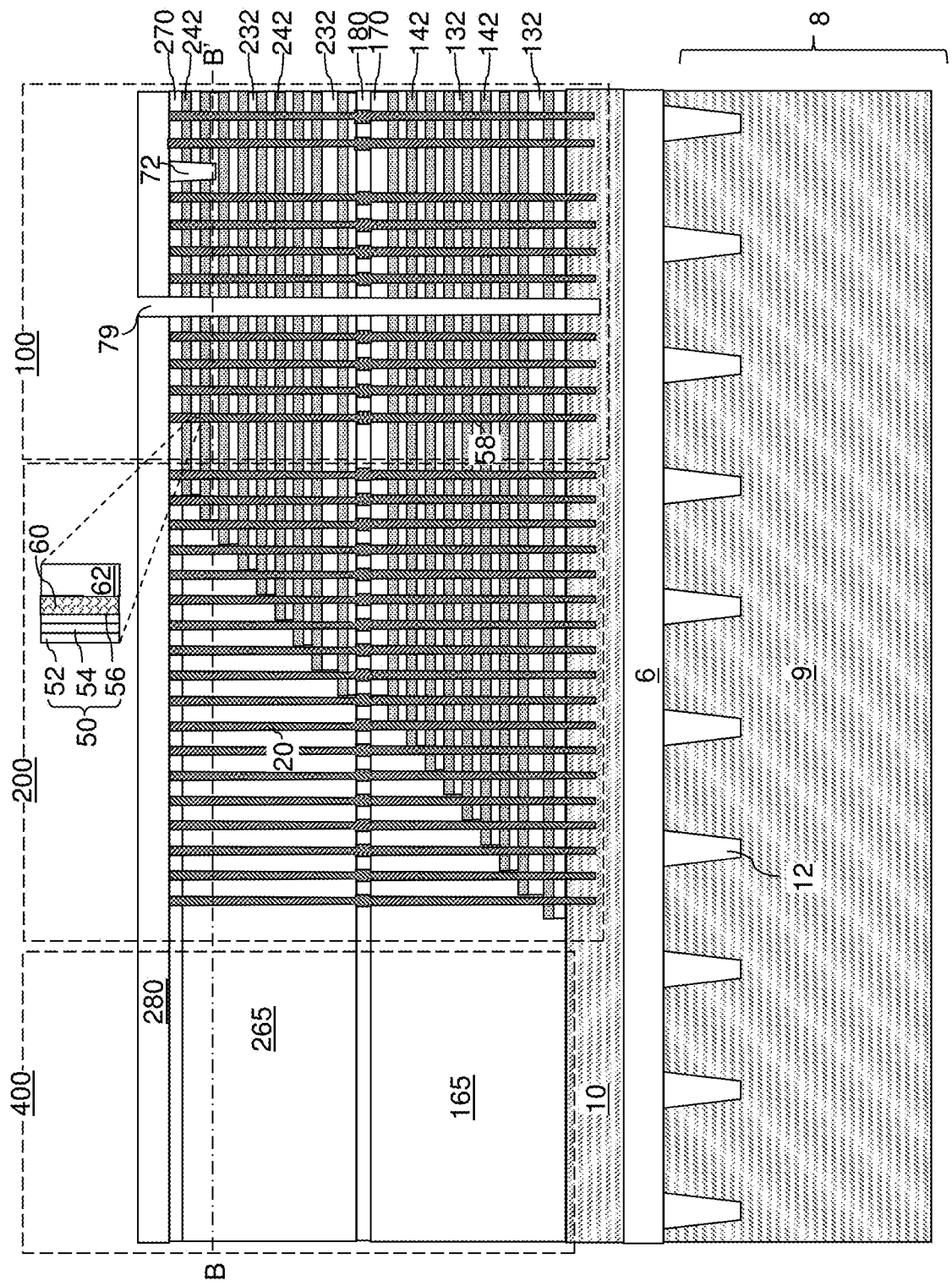
FIG. 13A is a vertical cross-sectional view of the exemplary structure after formation of a first contact-level dielectric layer and line trenches according to an embodiment of the present disclosure.

Referring to FIGS. 13A and 13B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer may be applied over the first contact-level dielectric layer 280 and may be lithographically patterned to form elongated openings that extend along the first horizontal direction hd1 between clusters of memory opening fill structures 58. Line trenches may be formed by transferring the pattern in the photoresist layer (not shown) through the first contact-level dielectric layer 280, the second-tier structure (232, 242, 270, 265, 72), and the first-tier structure (132, 142, 170, 165), and into the semiconductor material layer 10. Portions of the first contact-level dielectric layer 280, the second-tier structure (232, 242, 270, 265, 72), the first-tier structure (132, 142, 170, 165), and the semiconductor material layer 10 that underlie the openings in the photoresist layer may be removed to form the through-stack line trenches 79. The line trenches vertically extend through the first-tier alternating stack (132, 142) and the second-tier alternating stack (232, 242) as formed in preceding processing steps, and divide the first-tier alternating stack (132, 142) and the second-tier alternating stack (232, 242) as multiple alternating stacks including respective first insulating layers 132 (as divided by the line trenches), respective first sacrificial material layers 142 (as divided by the line trenches), respective second insulating layers 232 (as divided by the line trenches), and respective second sacrificial material layers (as divided by the line trenches). As such, the line trenches are herein referred to as through-stack line trenches 79.

In one embodiment, the through-stack line trenches 79 may be formed between clusters of memory stack structures 55. The clusters of the memory stack structures 55 may be laterally spaced apart along the second horizontal direction hd2 by the through-stack line trenches 79. The lengthwise direction of the through-stack line trenches 79 is the first horizontal direction hd1. In this embodiment, the lengthwise direction of the dielectric isolation rails 12 (e.g., silicon oxide rails) is the second horizontal direction hd2. Thus, the lengthwise direction of the through-stack line trenches 79 is perpendicular to the lengthwise direction of the dielectric isolation rails 12 in this embodiment. As used herein the first horizontal direction hd1 comprises a word line direction (i.e., the direction in which word lines extend), and the second horizontal direction hd2 comprises a bit line direction (i.e., the direction in which the bit lines extend).

The alternating stacks comprise stepped surfaces in which lateral extents of the sacrificial material layers (142, 242) decrease with a vertical distance from the semiconductor material layer 10, and stepped dielectric material portions (such as the first retro-stepped dielectric material portions 165) contact stepped surfaces of the alternating stacks and contact the semiconductor material layer 10. Generally, each of the alternating stacks comprises a respective array of memory openings 12 vertically extending therethrough, each array of memory openings 49 is filled with a respective array of memory opening fill structures 58, and each of the memory opening fill structures 58 comprises a respective memory stack structure 55.

Figure 14:
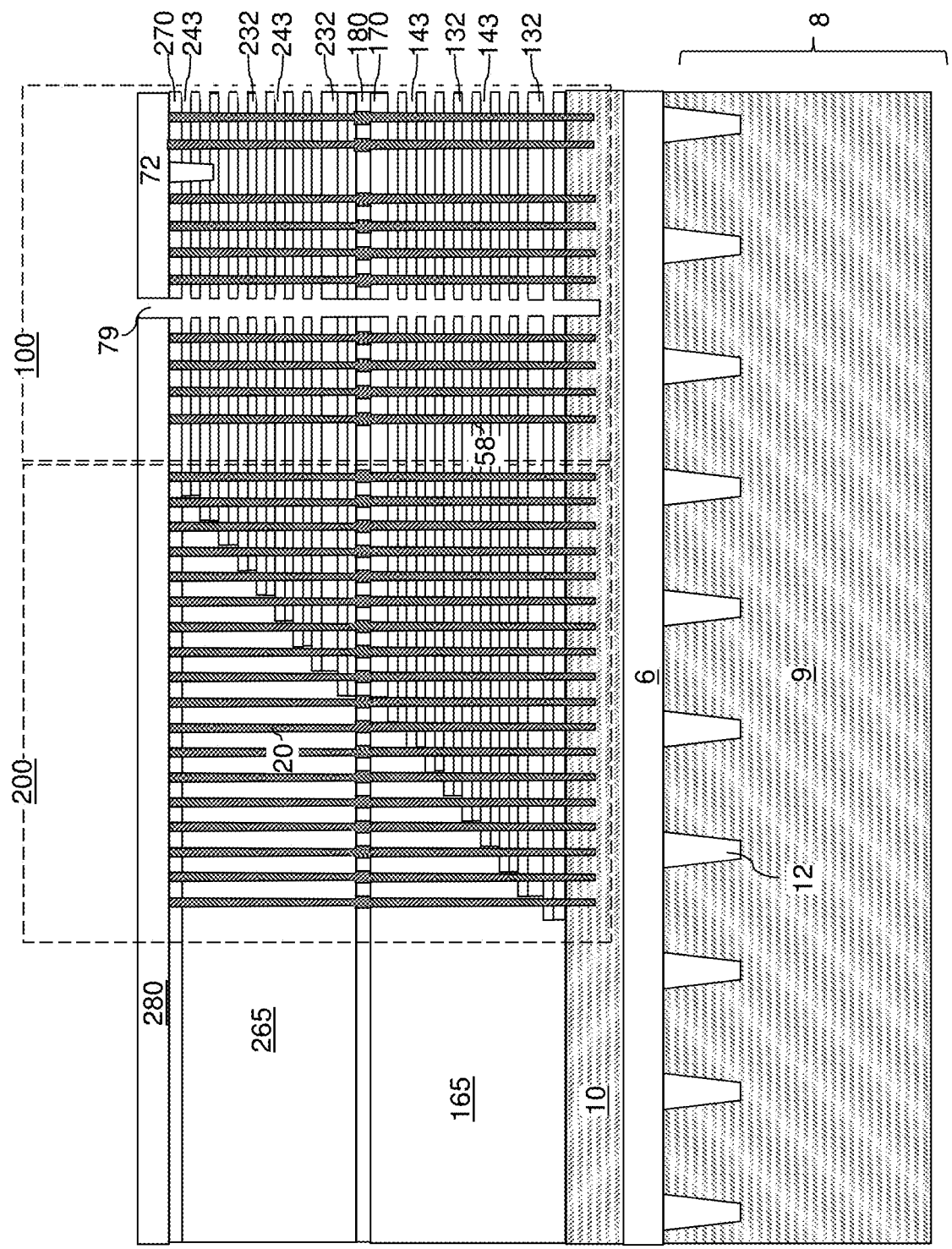
FIG. 14 is a vertical cross-sectional view of the exemplary structure after formation of backside recesses according to an embodiment of the present disclosure.

Referring to FIG. 14, the sacrificial material layers (142, 242) are removed selective to the insulating layers (132, 232), the first and second insulating cap layers (170, 270), and the first contact-level dielectric layer 280. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the through-stack line trenches 79, for example, using an isotropic etch process. The isotropic etch process may be a wet etch process using a wet etch solution, or may be a gas phase (dry) etch process in which the etchant is introduced in a vapor phase into the through-stack line trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 15A:
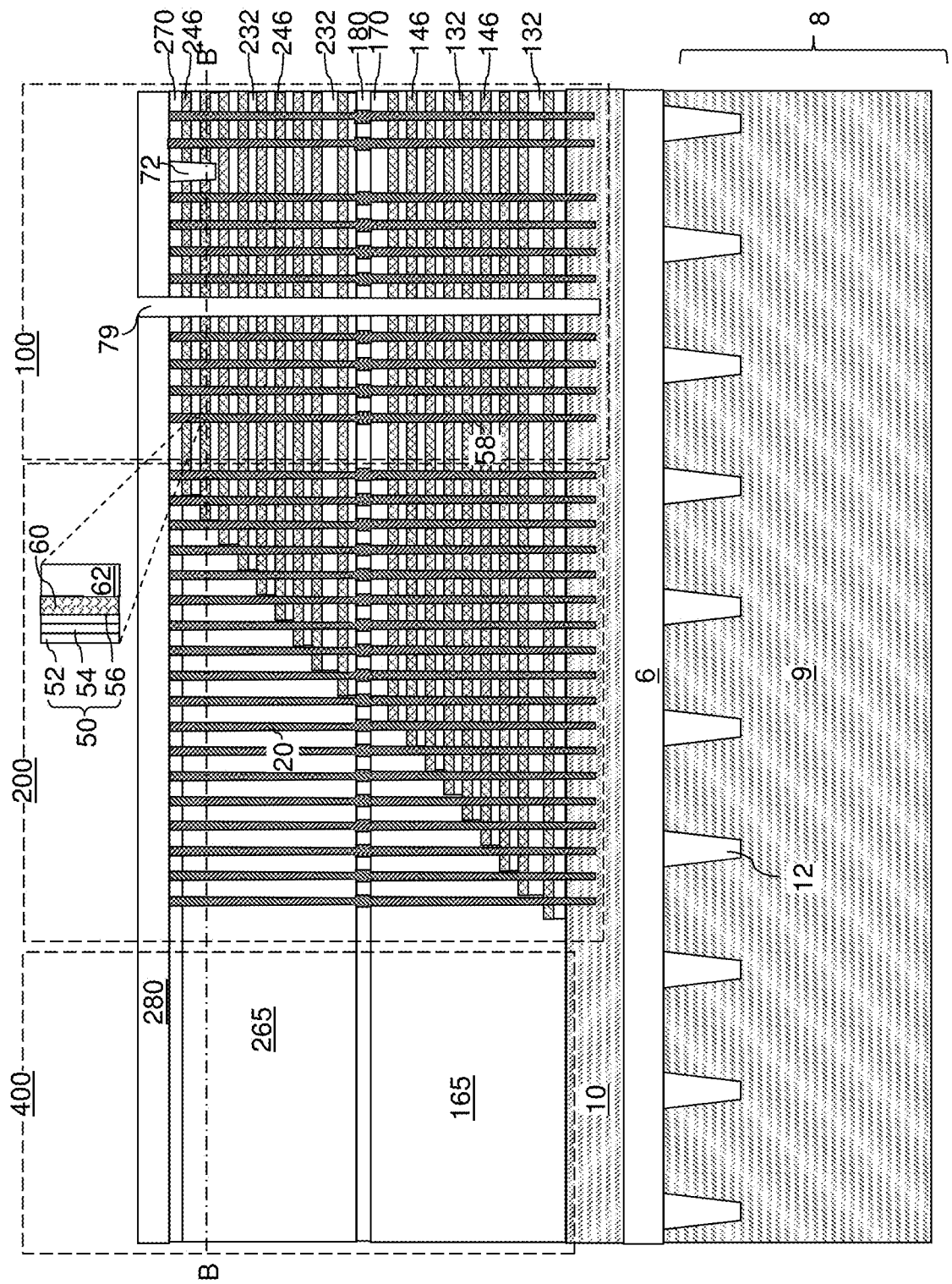
FIG. 15A is a vertical cross-sectional view of the exemplary structure after formation of electrically conductive layers according to an embodiment of the present disclosure.
Figure 15B:
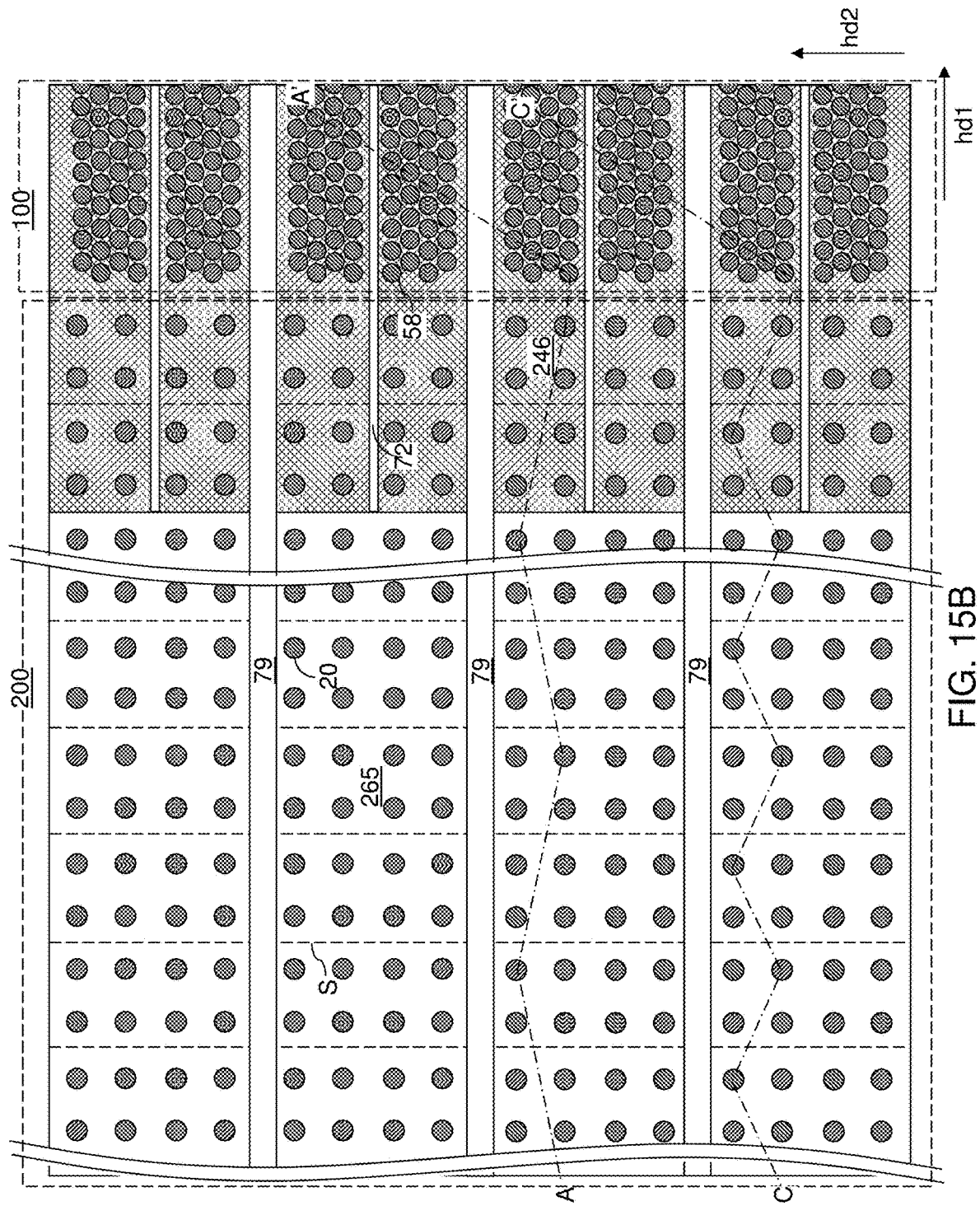
FIG. 15B is a horizontal cross-sectional view of the exemplary structure along the horizontal plane B-B' of FIG. 15A. The hinged vertical plane A-A' corresponds to the plane of the vertical cross-sectional view of FIG. 15A.
Figure 15C:
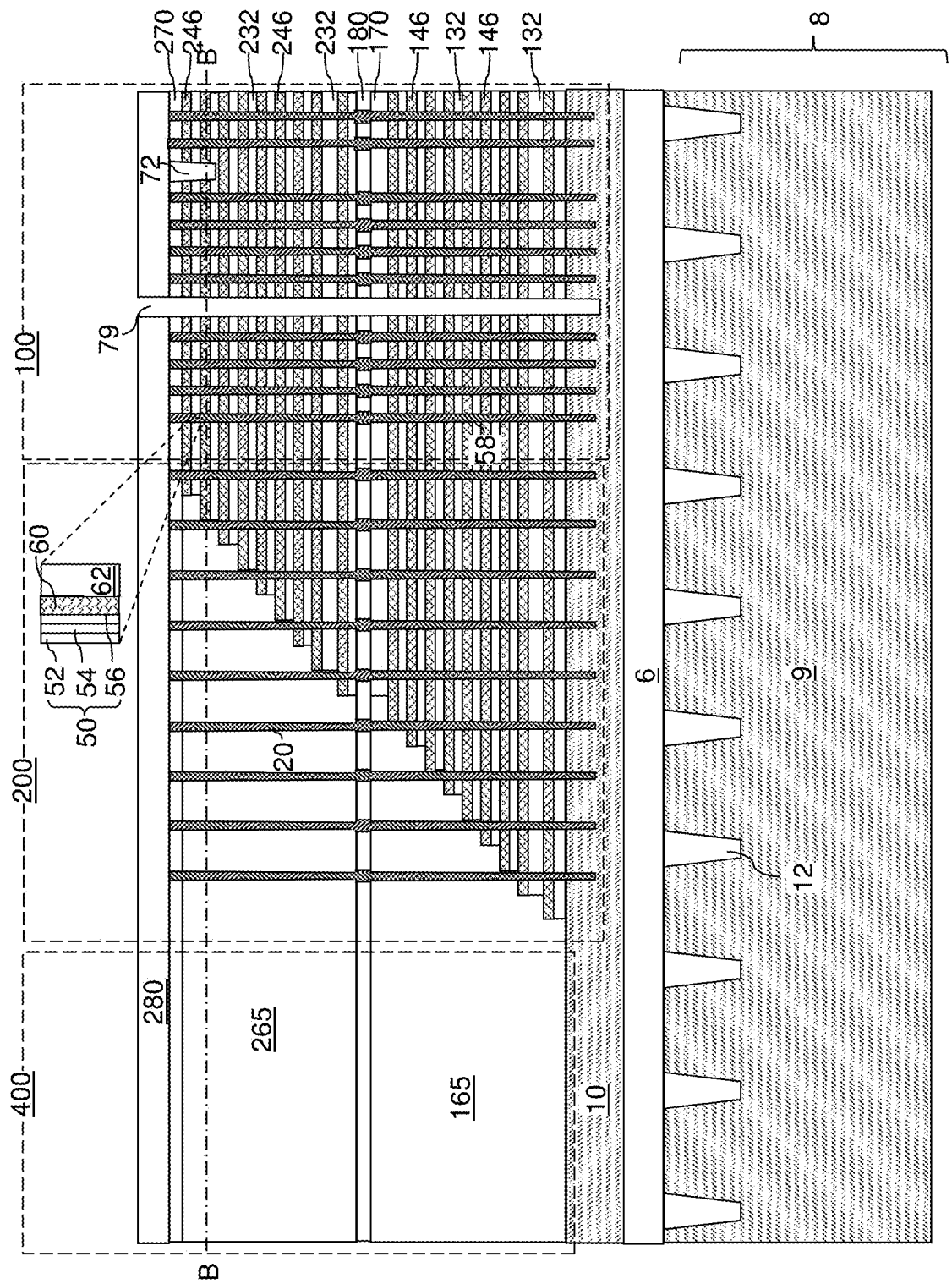
FIG. 15C is a vertical cross-sectional view of the exemplary structure along the hinged vertical cross-sectional plane C-C' of FIG. 15B according to an embodiment of the present disclosure.

Referring to FIGS. 15A-15C, at least one conductive material may be deposited in the plurality of backside recesses (143, 243), on the sidewalls of the through-stack line trenches 79, and over the first contact-level dielectric layer 280. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each through-stack line trench 79 and over the first contact-level dielectric layer 280. Residual conductive material (such as the continuous metallic material layer) may be removed from inside the through-stack line trenches 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective through-stack line trench 79.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces. Each of the memory stack structures 55 comprises a vertical stack of memory elements located at each level of the electrically conductive layers (146, 246). A subset of the middle electrically conductive layers (146, 246) may comprise word lines for the memory elements. The word lines extend in the first horizontal direction hd1. One or more bottommost electrically conductive layers 146 comprise source select gate electrode(s), and one or more topmost electrically conductive layers 246 comprise drain select gate electrode(s). Arrays of memory stack structures 55 vertically extend through the alternating stacks {(132, 232), (146, 246)}. Each of the memory stack structures 55 comprises a respective vertical stack of memory elements (for example, as embodied as portions of a memory material layer 54 located at levels of the electrically conductive layers (146, 246)) and a respective vertical semiconductor channel 60.

Generally, the silicon oxide dielectric isolation rails 12 are embedded within the substrate semiconductor layer 9 (e.g., in the substrate 8), and are laterally spaced apart along the first horizontal direction hd1. Each of the dielectric isolation rails 12 lateral extends along the second horizontal direction hd2 that is perpendicular to the first horizontal direction hd1. Alternating stacks of insulating layers (132, 232) and electrically conductive layers (146, 246) are formed over the substrate semiconductor layer 9. The alternating stacks {(132, 232), (146, 246)} are laterally spaced apart along the second horizontal direction hd2 by line trenches (such as the through-stack line trenches 79) that laterally extend along the first horizontal direction hd1. The alternating stacks, and especially the electrically conductive layers (146, 246), apply a stress to the substrate 8. The dielectric isolation rails 12 counteract the applied stress and reduce the warpage of the substrate 8.

Figure 16:
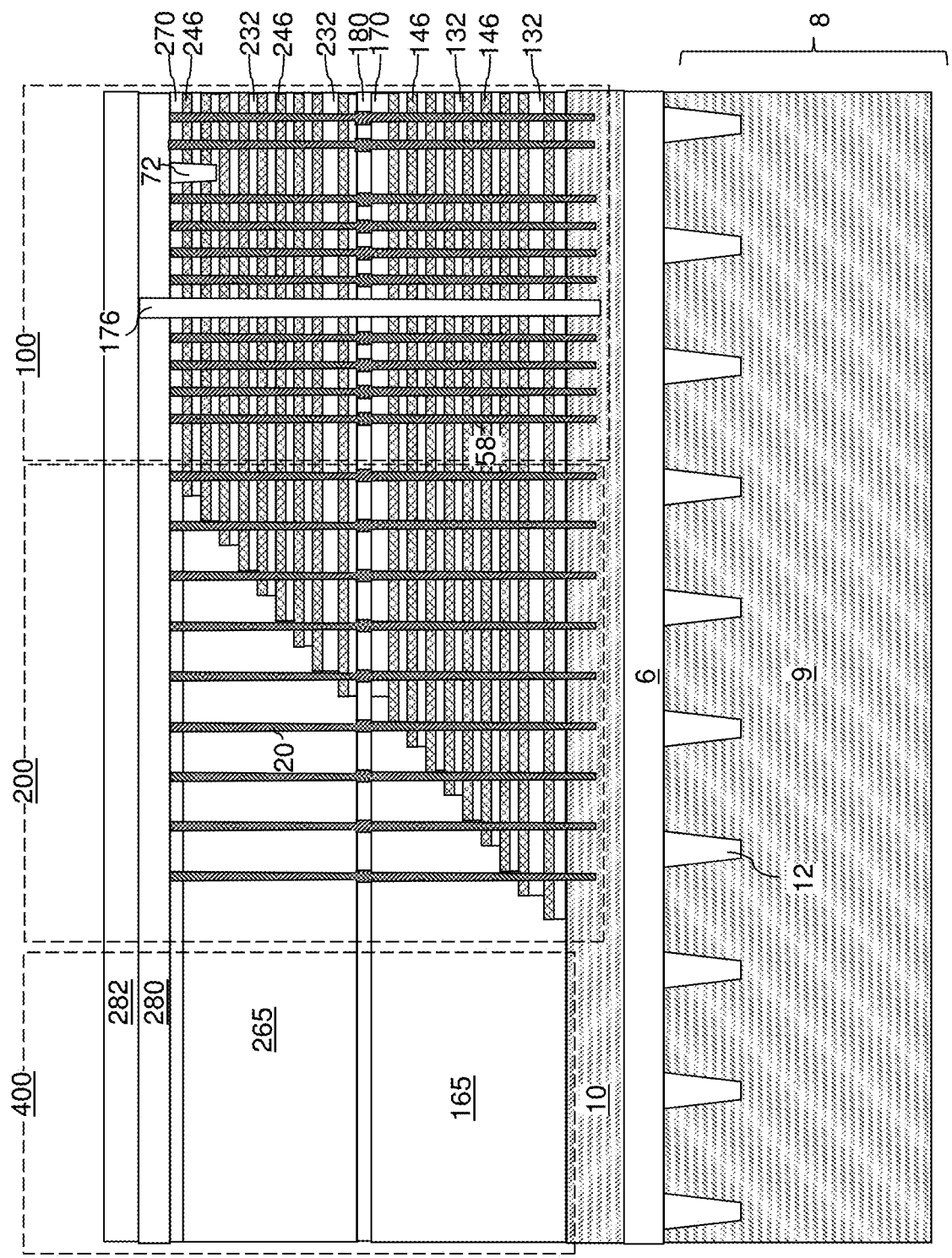
FIG. 16 is a vertical cross-sectional view of the exemplary structure after formation of line trench fill structures in the line trenches according to an embodiment of the present disclosure.

Referring to FIG. 16, a dielectric fill material may be conformally deposited in the through-stack line trenches 79 and over the first contact-level dielectric layer 280 by a conformal deposition process. The dielectric fill material may include, for example, undoped silicate glass, a doped silicate glass, or organosilicate glass. The conformal deposition process may comprise chemical vapor deposition. Each portion of the dielectric fill material that fills a respective through-stack line trench 79 constitutes a line trench fill structure 176, which may be a dielectric wall structure including a pair of straight lengthwise sidewalls that laterally extend along the first horizontal direction. The line trench fill structures 176 may contact each layer within a respective neighboring pair of alternating stacks {(132, 232), (146, 246)} among the alternating stacks {(132, 232), (146, 246)}. In one embodiment, the semiconductor material layer 10 may be located between the alternating stacks {(132, 232), (146, 246)} and the substrate semiconductor layer 9. The line trench fill structures 176 may vertically extend into the semiconductor material layer 10. A horizontally-extending portion of the dielectric fill material that overlies the first contact-level dielectric layer 280 constitutes a second contact-level dielectric layer 282. The second contact-level dielectric layer 282 may have a thickness in a range from 100 nm to 1,000 nm, although lesser and greater thicknesses may also be used.

Figure 17:
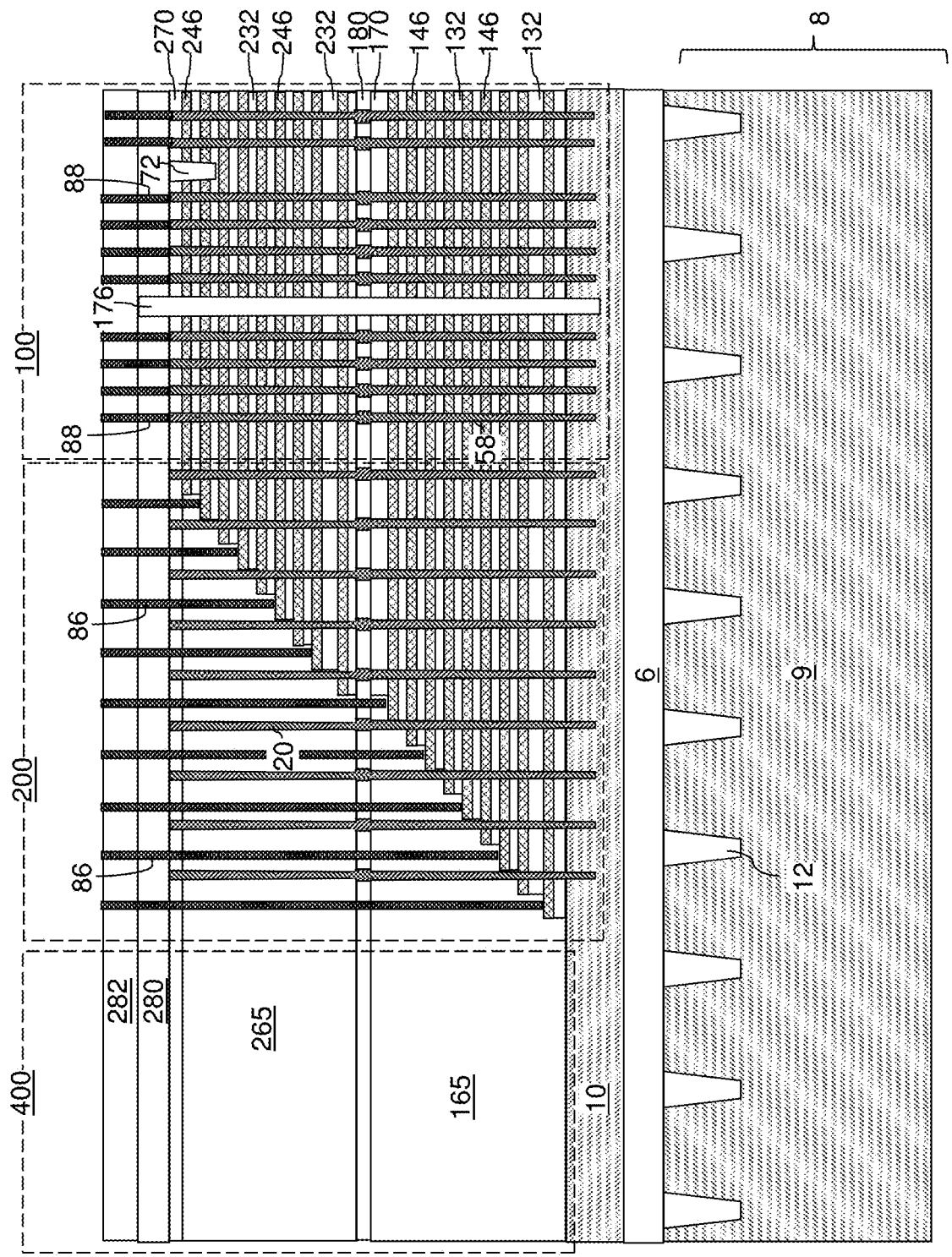
FIG. 17 is a vertical cross-sectional view of the exemplary structure after formation of a second contact-level dielectric layer and various contact via structures according to an embodiment of the present disclosure.

Referring to FIG. 17, a photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 18:
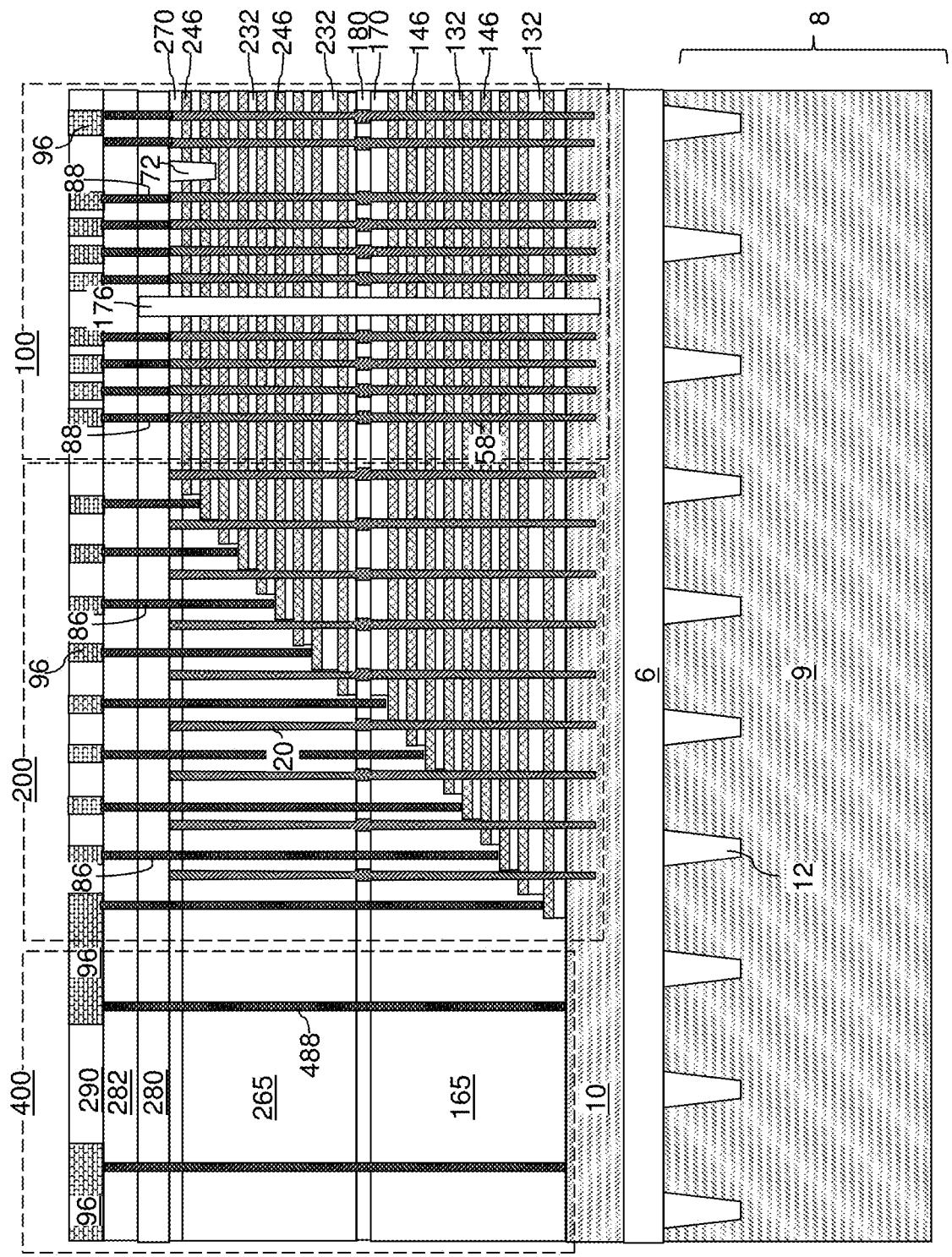
FIG. 18 is a vertical cross-sectional view of the exemplary structure after formation of through-memory-level via structures and upper metal line structures according to an embodiment of the present disclosure.

Referring to FIG. 18, peripheral-region via cavities may be formed through the second and first contact-level dielectric layers (282, 280) and the second and first retro-stepped dielectric material portions (265, 165), to top surfaces of the semiconductor material layer 10 in the peripheral device region 400. Through-dielectric connection via cavities may be formed through the second and first contact-level dielectric layers (282, 280) and the second and first retro-stepped dielectric material portions (265, 165). At least one conductive material may be deposited in the through-dielectric connection via cavities. Excess portions of the at least one conductive material may be removed from above the horizontal plane including the top surface of the second contact-level dielectric layer 282. Each remaining portion of the at least one conductive material in a through-dielectric connection via cavity constitutes a through-dielectric connection via structure 488. Generally, each through-dielectric connection via structure 488 may vertically extend through at least one of the stepped dielectric material portions (such as a first retro-stepped dielectric material portion 165 and/or a second retro-stepped dielectric material portion 265).

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the through-dielectric connection via structures 488. The bit lines 98 extend along the second horizontal direction hd2 and are spaced apart along the first horizontal direction hd1.

Figure 19:
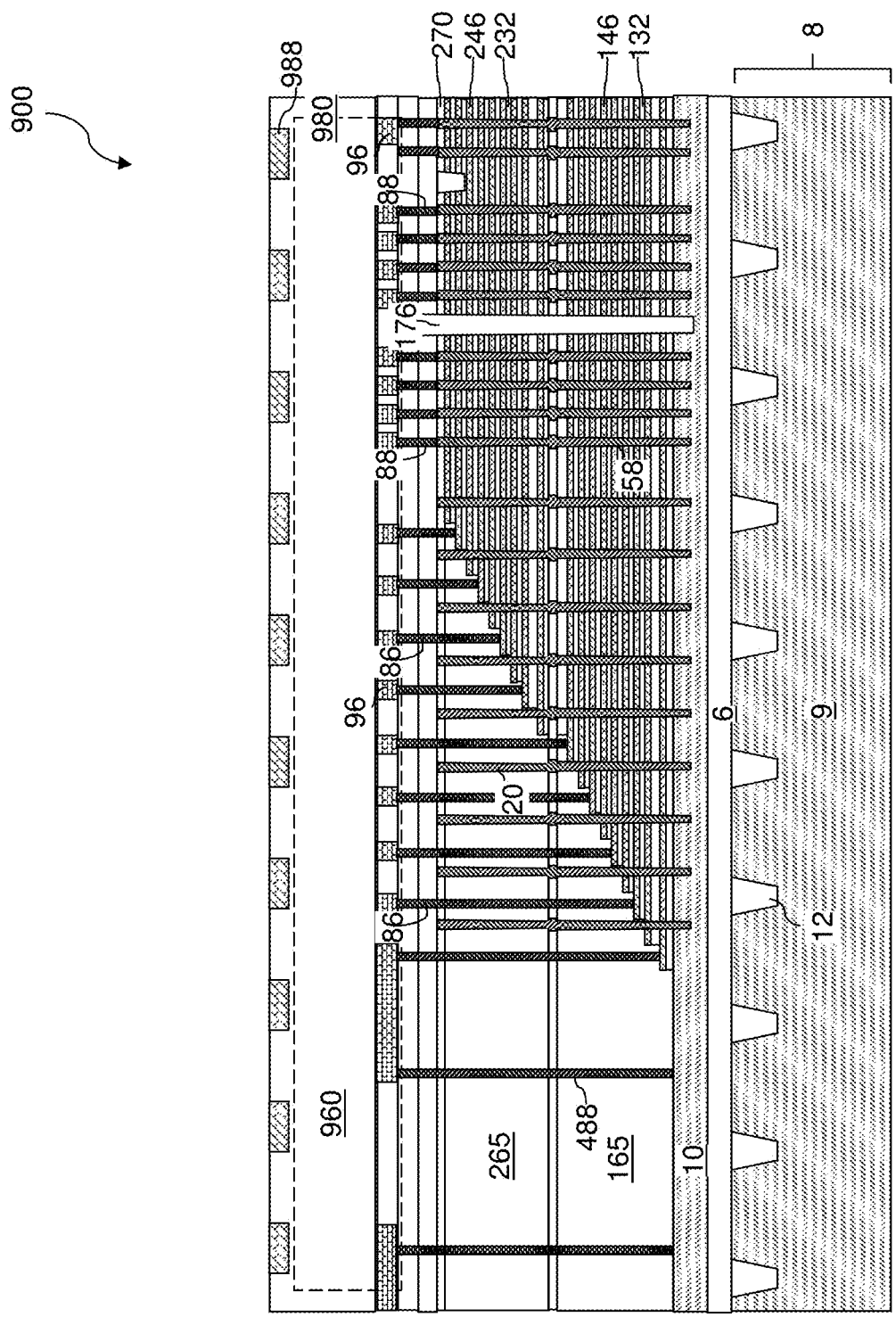
FIG. 19 is a vertical cross-sectional view of the exemplary structure after formation of a memory die including memory-side bonding pads according to an embodiment of the present disclosure.

Referring to FIG. 19, the upper-level metal interconnect structures may comprise additional metal interconnect structures embedded in additional dielectric material layers, which can be formed over the line-level dielectric layer 290. Bonding pads can be formed at the topmost level of the additional dielectric material layers to provide a memory die 900.

The upper-level metal interconnect structures are herein referred to as memory-side metal interconnect structures 980. The line-level dielectric layer 290 and the additional dielectric material layers are herein referred to as memory-side dielectric material layer 960. The bonding pads that are formed in the memory die are herein referred to memory-side bonding pads 988. Generally, memory-side dielectric material layers 960 embedding memory-side metal interconnect structures 980 can be formed over the alternating stacks {(132, 232), (146, 246)} and the line trench fill structures 176. The memory die 900 comprises the substrate 8 containing the substrate semiconductor layer 9, the dielectric isolation rails 12, the alternating stacks {(132, 232), (146, 246)}, the arrays of memory stack structures 55, the memory-side dielectric material layers 960, and the memory-side metal interconnect structures 980. The memory-side dielectric material layers 960 may embed the memory-side bonding pads 988.

Figure 20:
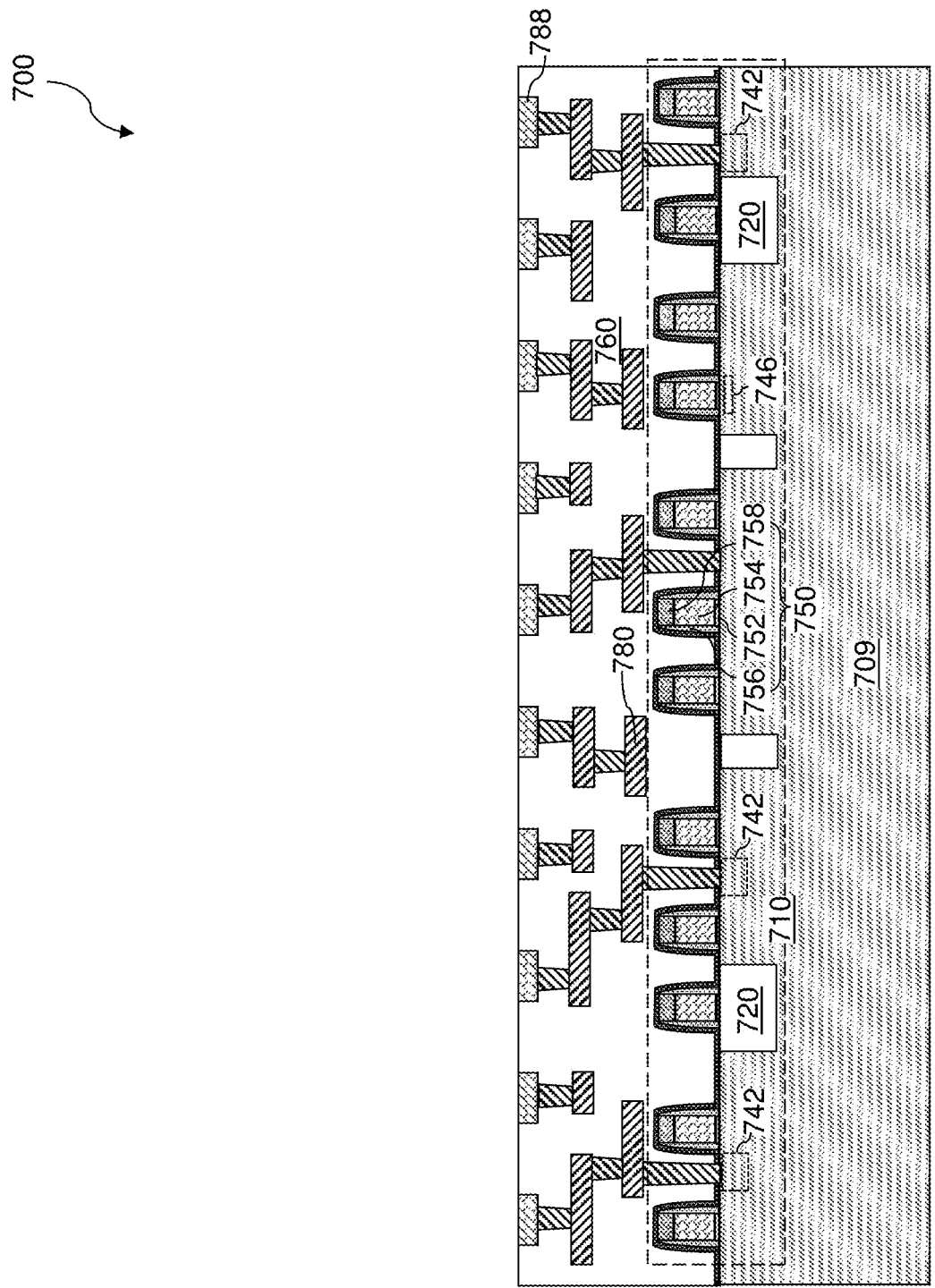
FIG. 20 is a vertical cross-sectional view of a logic die including a peripheral circuit for the memory die according to an embodiment of the present disclosure.

Referring to FIG. 20, a logic die 700 according to an embodiment of the present disclosure is provided, which includes a peripheral circuit 710 for controlling operation of the memory stack structures 55 in the memory die 900. The logic die 700 may comprise a logic-side semiconductor substrate 709, the peripheral circuit 710 including various semiconductor devices therein, logic-side dielectric material layers 760 embedding logic-side metal interconnect structures 7890, and logic-side bonding pads 788 embedded in a topmost layer within the logic-side dielectric material layers 760. The peripheral circuit is configured to control operation of the arrays of memory stack structures 55 within the memory die 900. The various semiconductor devices of the peripheral circuit 710 may be electrically isolated among one another by shallow trench isolation structures 720. The various semiconductor devices of the peripheral circuit 710 may comprise field effect transistors including a respective gate stack 750, a respective semiconductor channel 746 that may be a surface portion of the logic-side semiconductor substrate 709, and a respective pair of source/drain regions 742. Each gate stack 750 may comprise a gate dielectric 752, a gate electrode 754, a dielectric gate cap 758, and a dielectric gate spacer 756.

Figure 21:
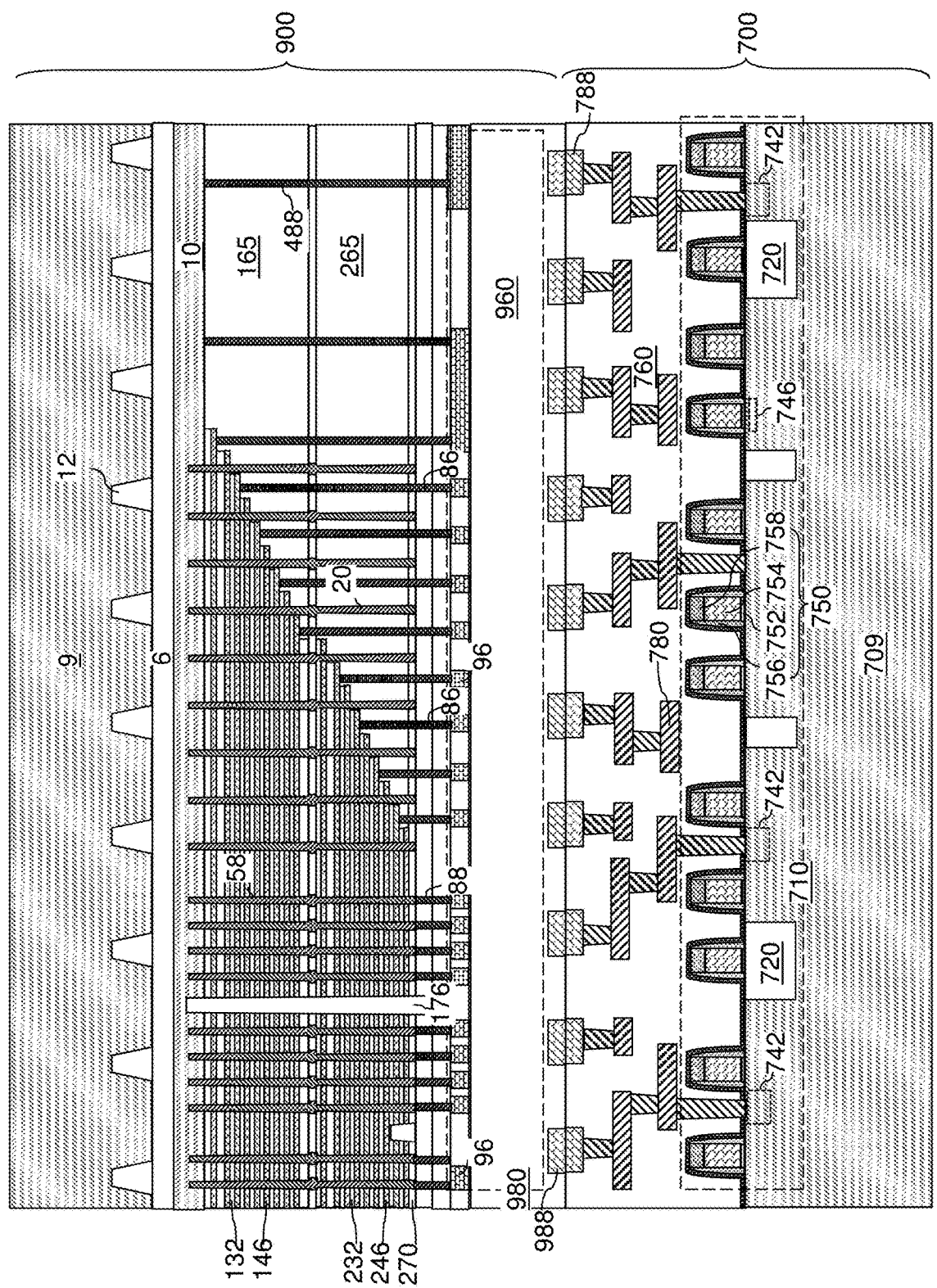
FIG. 21 is a vertical cross-sectional view of the exemplary structure after bonding the logic die to the memory die according to an embodiment of the present disclosure.

Referring to FIG. 21, the logic die 700 and the memory die 900 can be oriented such that the logic-side bonding pads 788 face the memory-side bonding pads 988. The logic die 700 and the memory die 900 are brought into contact with each other such that the logic-side bonding pads 788 contact the memory-side bonding pads 988. A thermal anneal process can be performed at an elevated temperature while the logic die 700 and the memory die 900 are pressed against each other to induce metal-to-metal bonding between the mating pairs of the logic-side bonding pads 788 and the memory-side bonding pads 988. Optionally, dielectric-to-dielectric bonding may occur between contacting surfaces of the logic-side dielectric material layers 760 and the memory-side dielectric material layers 960. The elevated temperature may be in a range from 250 degrees Celsius to 450 degrees Celsius, although lower and higher temperatures may also be employed. Generally, the logic die 700 can be bonded to the memory die 900 such that the arrays of memory stack structures 55 are electrically connected to the peripheral circuit 710.

Figure 22:
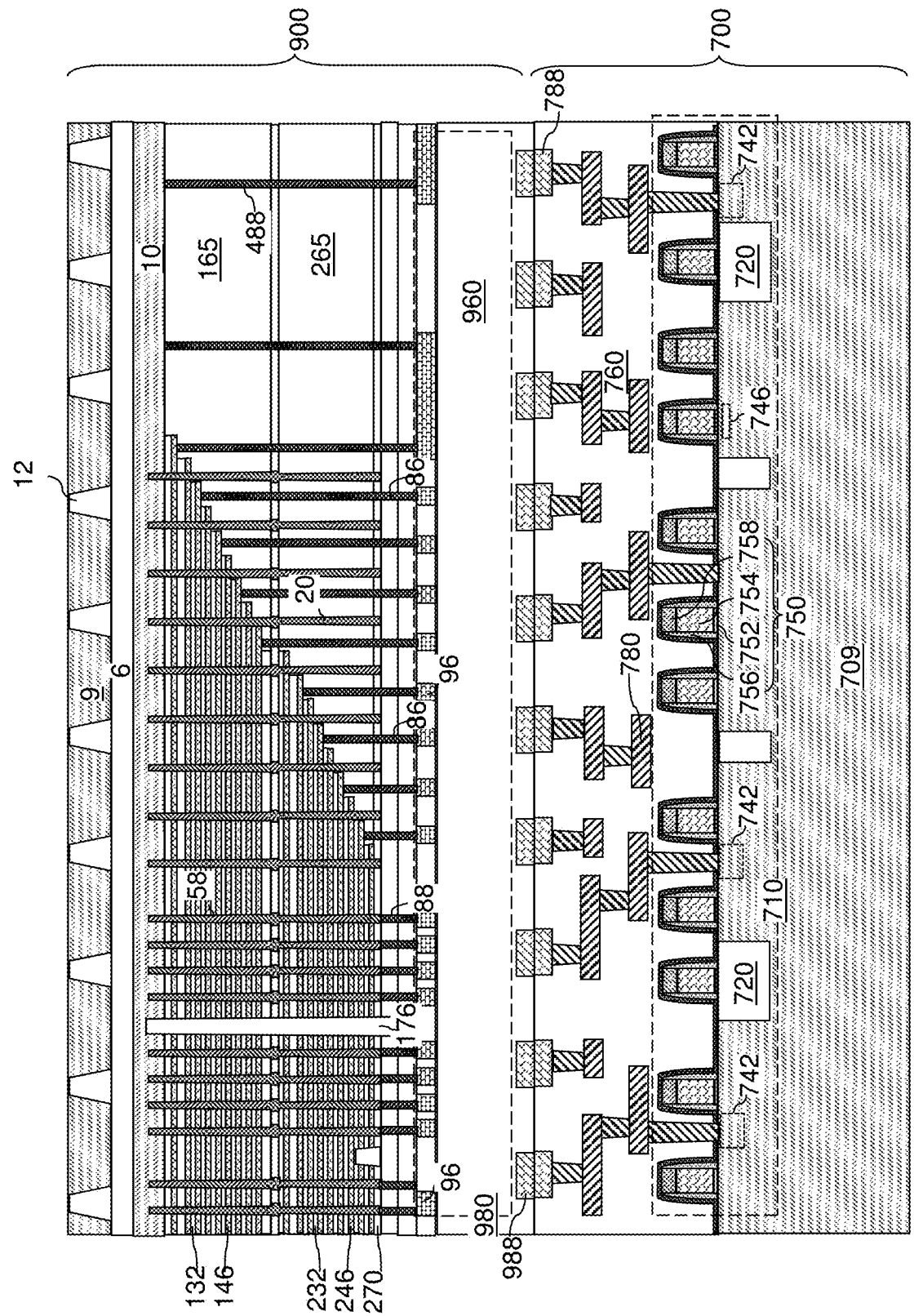
FIG. 22 is a vertical cross-sectional view of the exemplary structure after thinning the semiconductor substrate of the memory die according to an embodiment of the present disclosure.

Referring to FIG. 22, the semiconductor substrate of the memory die 900 can be thinned from the backside. Specifically, the substrate 8 can be thinned from the backside by grinding, mechanical polishing, isotropic etching, anisotropic etching, or a combination thereof. According to an aspect of the present disclosure, thinning of the substrate 8 may continue until horizontal surfaces of dielectric rail structures 12 that are distal from the bonding interface between the memory die 900 and the logic die 700 are physically exposed. The physically exposed horizontal surfaces of dielectric rail structures 12 that are distal from the bonding interface between the memory die 900 and the logic die 700 are herein referred to as distal horizontal surfaces of the dielectric rail structures 12. The horizontal surfaces of the dielectric rail structures 12 that contact the insulating material layer 6 are herein referred to as proximal horizontal surfaces of the dielectric rail structures 12.

Generally, each of the dielectric isolation rails 12 has a proximal horizontal surface and a distal horizontal surface that is more distal from the alternating stacks {(132, 232), (146, 246)} along a vertical direction than the proximal horizontal surface. The proximal horizontal surface has a greater width along the first horizontal direction hd1 than the distal horizontal surface due to the finite taper angle that is present during formation of the substrate line trenches 11. In one embodiment, the dielectric isolation rails 12 are arranged as a periodic one-dimensional array having a uniform pitch along the first horizontal direction hd1. The dielectric isolation rails 12 are embedded in the remaining portion of the substrate 8, such as in the substrate semiconductor layer 9. In one embodiment, the substrate semiconductor layer 9 may comprise semiconductor material rails that laterally extend along the second horizontal direction hd2 and interlaced with the dielectric isolation rails 12 along the first horizontal direction hd1. The semiconductor material rails may have a respective uniform width along the first horizontal direction.

In one embodiment, the insulating material layer 6 can be disposed between the substrate semiconductor layer 9 and the semiconductor material layer 10. In one embodiment, the semiconductor material layer 10 can be in contact with horizontal surfaces of the alternating stacks {(132, 232), (146, 246)}. In one embodiment, the semiconductor material layer 10 comprises a horizontal semiconductor channel that is electrically connected to the vertical semiconductor channels 60.

Figure 23:
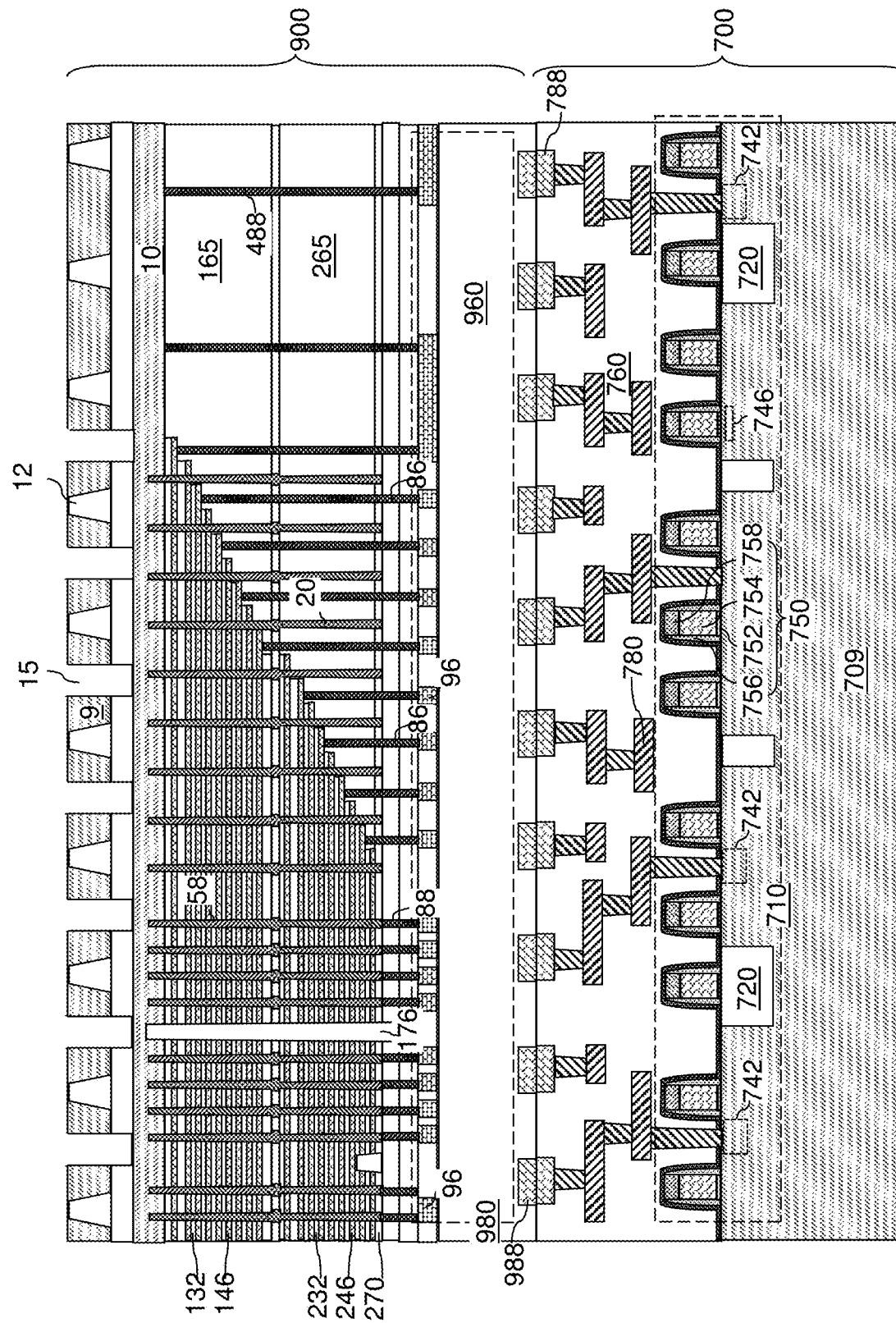
FIG. 23 is a vertical cross-sectional view of the exemplary structure after formation of first through-substrate via cavities according to an embodiment of the present disclosure.

Referring to FIG. 23, a first photoresist layer (not shown) can be applied on the backside surface (i.e., the distal surface) of the substrate semiconductor layer 9 and the distal horizontal surfaces of the dielectric isolation rails 12. The first photoresist layer can be lithographically patterned to form a pattern of discrete openings therethrough in areas that overlie a respective semiconductor material rail in the substrate semiconductor layer 9. A first anisotropic etch process can be performed to transfer the pattern of the openings in the first photoresist layer through the substrate semiconductor layer 9 and the insulating material layer 6 down to a backside surface (i.e., a distal surface) of the semiconductor material layer 10. First through-substrate via cavities 15 are formed through the substrate semiconductor layer 9 and the insulating material layer 6 such that a portion of a backside surface of the semiconductor material layer 10 is physically exposed at the bottom of each of the first through-substrate via cavities 15. The first photoresist layer can be subsequently removed, for example, by ashing.

Figure 24:
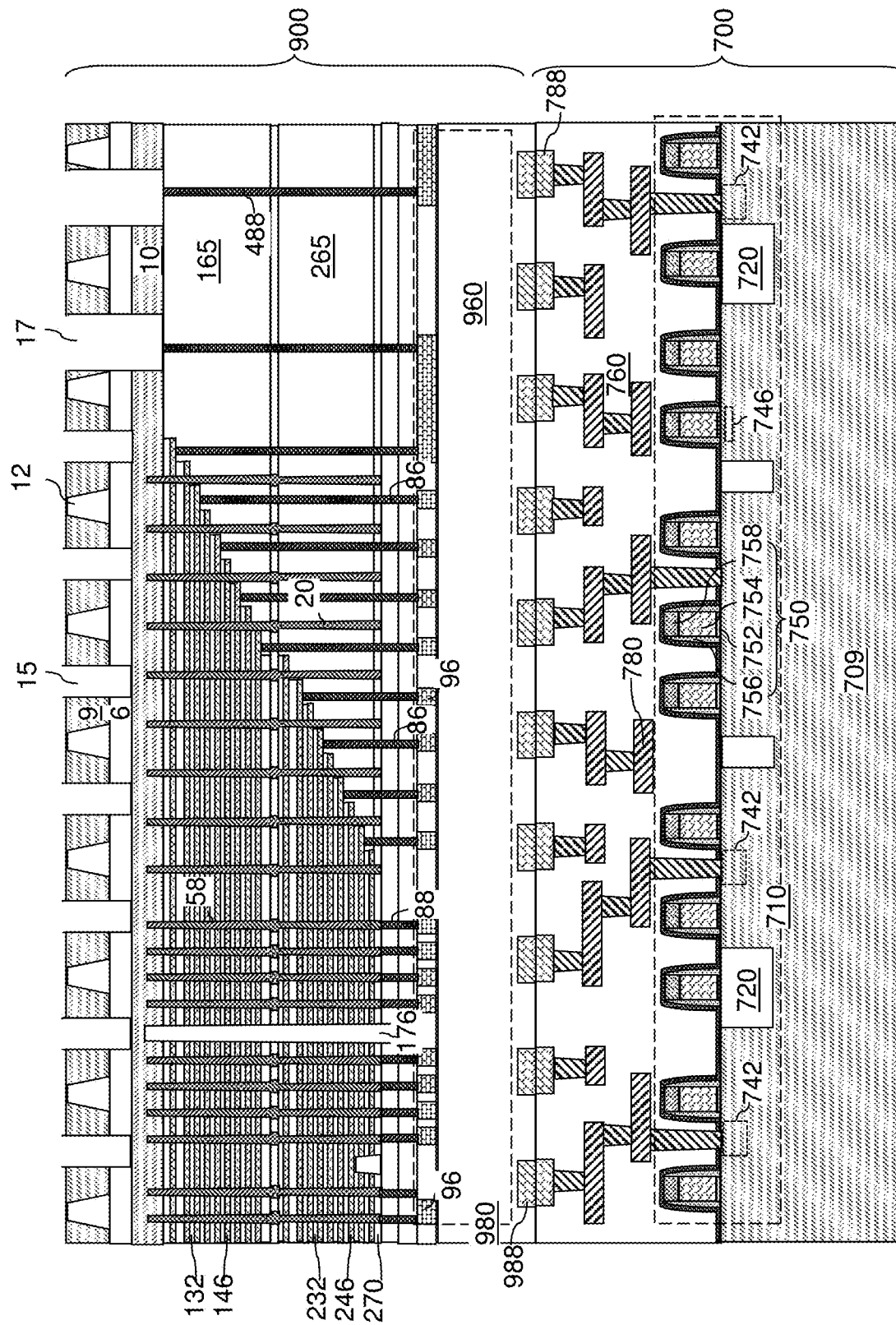
FIG. 24 is a vertical cross-sectional view of the exemplary structure after formation of second through-substrate via cavities according to an embodiment of the present disclosure.

Referring to FIG. 24, a second photoresist layer (not shown) can be applied on the backside surface (i.e., the distal surface) of the substrate semiconductor layer 9 and the distal horizontal surfaces of the dielectric isolation rails 12. The second photoresist layer can be lithographically patterned to form a pattern of discrete openings therethrough in areas that overlie a respective through-dielectric connection via structure 488. A second anisotropic etch process can be performed to transfer the pattern of the openings in the second photoresist layer through the substrate semiconductor layer 9 and the insulating material layer 6 down to a backside surface (i.e., a distal surface) of a stepped dielectric material portion (such as a first retro-stepped dielectric material portion 165). Second through-substrate via cavities 17 are formed through the substrate semiconductor layer 9 and the insulating material layer 6 such that an end surface of a through-dielectric connection via structure 488 and a portion of a stepped dielectric material portion is physically exposed at the bottom of each of the second through-substrate via cavities 17. The second photoresist layer can be subsequently removed, for example, by ashing.

Figure 25:
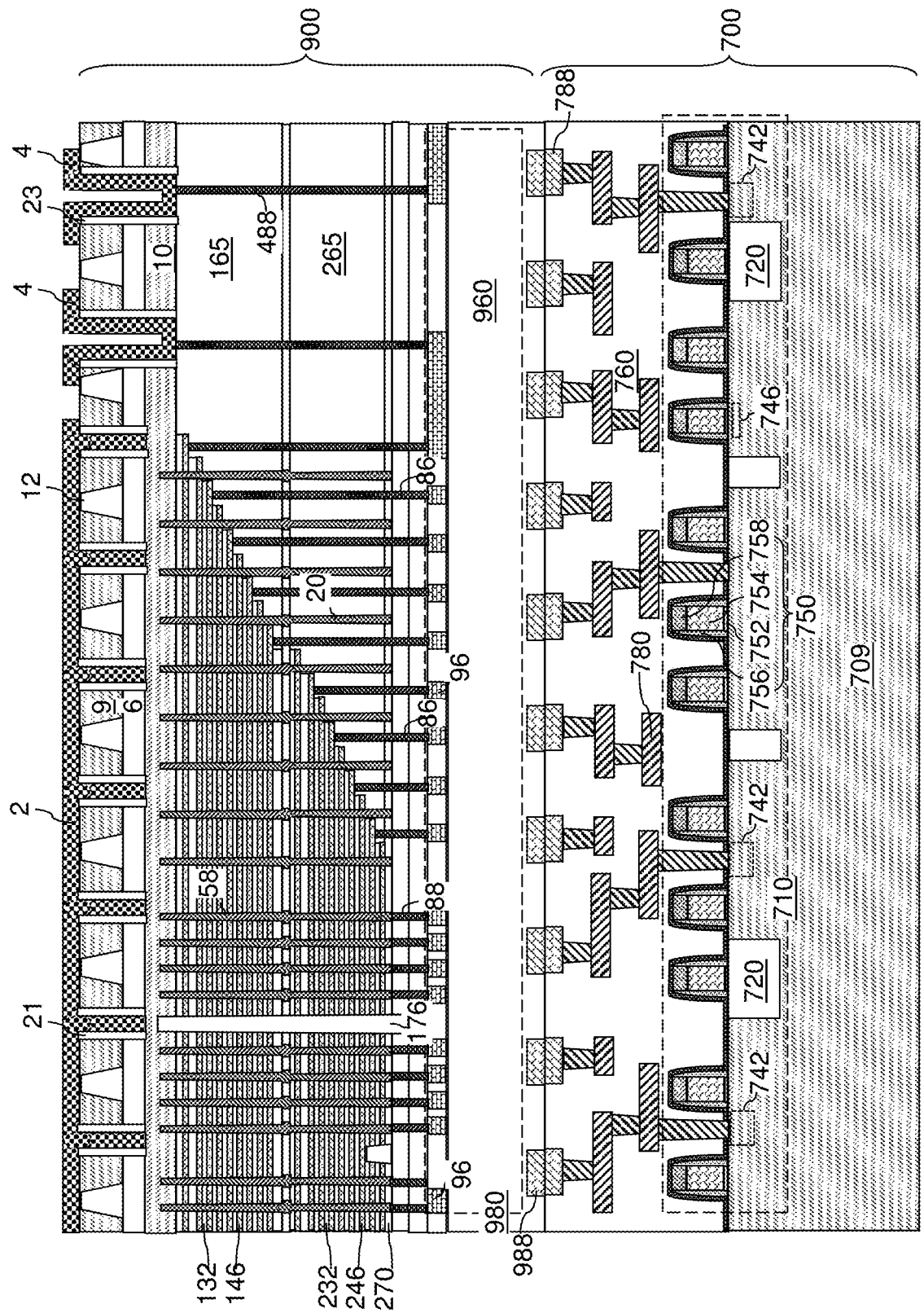
FIG. 25 is a vertical cross-sectional view of the exemplary structure after formation of a metallic source contact layer according to an embodiment of the present disclosure.

Referring to FIG. 25, a conformal insulating material layer may be optionally deposited in peripheral portions of the through-substrate via cavities (15, 17), and an anisotropic etch process may be performed to remove horizontally-extending portions of the conformal insulating material layer. Each remaining tubular portion of the conformal insulating material layer that remains in a first through-substrate via cavity 15 constitutes a first insulating spacer 21. Each remaining tubular portion of the conformal insulating material layer that remains in a second through-substrate via cavity 17 constitutes a second insulating spacer 23.

At least one metallic material can be deposited in remaining volumes of the through-substrate via cavities (15, 17) by a conformal or non-conformal deposition process. The at least one metallic material may comprise a metallic barrier liner (such as a TiN liner, a TaN liner, and/or a WN liner) and a metallic fill material (such as W, Cu, Ru, Co, Mo, etc.). The at least one metallic material can be subsequently patterned to form a metallic source contact layer 2 that continuously extends over a plurality of dielectric isolation rails 12 and fills volumes of the first through-substrate via cavities 15 that are not filled with the first insulating spacers 21. Thus, the metallic source contact layer 2 comprises vertically-extending via portions that vertically extend through the substrate semiconductor layer 9 and the insulating material layer 6 and contacting a distal surface of the semiconductor material layer 10.

Additional patterned portions of the at least one metallic material may comprise through-substrate via structure 4 vertically extending through the substrate semiconductor layer 9, the insulating material layer 6, and the semiconductor material layer 10 and contacting a respective one of the through-dielectric connection via structures 488. Generally, a through-dielectric connection via structure 488 can vertically extend through one of the stepped dielectric material portions, and a through-substrate via structure 4 can vertically extend through the substrate semiconductor layer 9, the insulating material layer 6, and the semiconductor material layer 10, and can contact the through-dielectric connection via structure 488.

FIGS. 26A and 26B illustrate an alternative exemplary structure after formation of alternative dielectric isolation rails 112 in the substrate line trenches according to an alternative embodiment of the present disclosure, which may be derived from the exemplary structure of FIGS. 2A and 2B. In the alternative embodiment, the alternative dielectric isolation rails 112 extend in the first horizontal direction (i.e., word line direction) hd1 and are spaced apart along the second horizontal direction hd2. The alternative dielectric isolation rails 112 may comprise a material which is in an opposite type of stress compared to the stress of the dielectric isolation rails 12. For example, if the dielectric isolation rails 12 comprise silicon oxide rails in compressive stress which apply a tensile stress to the substrate 8, then the alternative dielectric isolation rails 112 may comprise silicon nitride or silicon oxynitride which is in tensile stress and which apply a compressive stress to the substrate 8. The alternative dielectric isolation rails 112 extend perpendicular to the dielectric isolation rails 12 because the alternative dielectric isolation rails 112 apply an opposite type stress than the dielectric isolation rails 12.

The alternative dielectric isolation rails 112 may be formed by forming the substrate line trenches 11 which laterally extend along the first horizontal direction hd1 and then filling them with the material (e.g., silicon nitride) of the alternative dielectric isolation rails 112. The process then continues as described above with respect to the prior embodiment illustrated in FIGS. 3 to 25.

Referring to all drawings and according to various embodiments of the present disclosure, a semiconductor structure comprising a memory die 900 is provided. The memory die 900 comprises: dielectric isolation rails (12, 112) embedded within a substrate semiconductor layer 9; alternating stacks of insulating layers (132, 232) and electrically conductive layers (146, 246) located over the substrate semiconductor layer 9, wherein the alternating stacks {(132, 232), (246, 246)} are laterally spaced apart along a second horizontal direction hd2 by line trenches 79 that laterally extend along a first horizontal direction hd1; and arrays of memory stack structures vertically extending through the alternating stacks {(132, 232), (246, 246)}, wherein each of the memory stack structures 55 comprises a respective vertical stack of memory elements (such as portions of a memory material layer 54 located at levels of the electrically conductive layers (146, 246)) and a respective vertical semiconductor channel 60.

In one embodiment, the memory die 900 comprises: a semiconductor material layer in contact with horizontal surfaces of the alternating stacks {(132, 232), (246, 246)} and comprising a horizontal semiconductor channel that is electrically connected to the vertical semiconductor channels 60; and an insulating material layer 6 disposed between the substrate semiconductor layer 9 and the semiconductor material layer 10. In one embodiment, proximal horizontal surfaces of the dielectric isolation rails (12, 112) contact the insulating material layer 6.

In one embodiment, the memory die 900 comprises a metallic source contact layer 2 located on a distal horizontal surface of the substrate semiconductor layer 9 and comprising vertically-extending via portions that vertically extend through the substrate semiconductor layer 9 and the insulating material layer 6 and contacts a distal surface of the semiconductor material layer 10. In one embodiment, the metallic source layer 2 contacts distal horizontal surfaces of the dielectric isolation rails (12, 112).

In one embodiment, the alternating stacks {(132, 232), (246, 246)} comprise stepped surfaces in which lateral extents of the electrically conductive layers (146, 246) decrease with a vertical distance from the semiconductor material layer 10; and the memory die 900 further comprises stepped dielectric material portions (such as a first retro-stepped dielectric material potion 165) contacting the stepped surfaces of the alternating stacks {(132, 232), (246, 246)} and contacting the semiconductor material layer 10. In one embodiment, the memory die 900 further comprises: a through-dielectric connection via structure 488 vertically extending through one of the stepped dielectric material portions; and a through-substrate via structure 4 vertically extending through the substrate semiconductor layer 9, the insulating material layer 6, and the semiconductor material layer 10 and contacting the through-dielectric connection via structure 488.

In one embodiment, the memory die 900 further comprises line trench fill structures 176 located within the line trenches 79 and contacting each layer within a respective neighboring pair of alternating stacks {(132, 232), (246, 246)}. In one embodiment, the line trench fill structures 176 vertically extend into the semiconductor material layer 10.

In one embodiment illustrated in FIGS. 2A to 25, the dielectric isolation rails 12 are laterally spaced apart along the first horizontal direction hd1 and laterally extend along the second horizontal direction hd2; and the dielectric isolation rails 12 comprise silicon oxide. In the alternative embodiment illustrated in FIGS. 26A and 26B, the dielectric isolation rails 112 are laterally spaced apart along the second horizontal direction hd2 and laterally extend along the first horizontal direction hd1; and the dielectric isolation rails 112 comprise silicon nitride.

In one embodiment, the memory die 900 further comprises memory-side dielectric material layers 960 embedding memory-side metal interconnect structures 980 and vertically spaced from the substrate semiconductor layer 9 by the alternating stacks {(132, 232), (246, 246)}. In one embodiment, the semiconductor structure further comprises a logic die 700 bonded to the memory die 900, wherein the logic die 700 comprises a peripheral circuit 710 configured to control operation of the arrays of memory stack structures 55 within the memory die 900. In one embodiment, the logic die 700 comprises logic-side dielectric material layers 760 embedding logic-side metal interconnect structures 780 and logic-side bonding pads 788; and the memory-side dielectric material layers 960 embed memory-side bonding pads 988 that are bonded to the logic-side bonding pads 788.

In one embodiment, each of the dielectric isolation rails (12, 112) has a proximal horizontal surface and a distal horizontal surface that is more distal from the alternating stacks {(132, 232), (246, 246)} along a vertical direction than the proximal horizontal surface; the proximal horizontal surface has a greater width along the first horizontal direction hd1 than the distal horizontal surface; and the dielectric isolation rails (12, 112) are arranged as a periodic one-dimensional array having a uniform pitch along either the first or the second horizontal direction.

Generally, the lengthwise direction of the through-stack line trenches 79 of the structures of the present disclosure is the direction along which the deformation in the alternating stacks {(132, 232), (146, 246)} laterally propagate within the memory die 900. According to an aspect of the present disclosure, the dielectric isolation rails (12, 112) embedded in the substrate semiconductor layer 9 counter-balance the substrate warpage and deformation caused by the alternating stacks {(132, 232), (146, 246)}. The dielectric isolation rails (12, 112) can suppress the warpage of the memory die 900 prior to and during bonding of the memory die 900 and the logic die 700. Thus, the bonding yield and the overall product yield of a semiconductor chip including a memory die 900 and a logic die 700 can be increased through reduction of the warpage in the memory die 900.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a memory die, wherein the memory die comprises:
   dielectric isolation rails embedded within a substrate semiconductor layer;
   alternating stacks of insulating layers and electrically conductive layers located over the substrate semiconductor layer, wherein the alternating stacks are laterally spaced apart along a second horizontal direction by line trenches that laterally extend along a first horizontal direction;
   arrays of memory stack structures vertically extending through the alternating stacks, wherein each of the memory stack structures comprises a respective vertical stack of memory elements and a respective vertical semiconductor channel; and
   a metallic source contact layer located on a distal horizontal surface of the substrate semiconductor layer and contacting distal horizontal surfaces of the dielectric isolation rails.

2. The semiconductor structure of claim 1, wherein the memory die further comprises:
   a semiconductor material layer in contact with horizontal surfaces of the alternating stacks; and
   an insulating material layer disposed between the substrate semiconductor layer and the semiconductor material layer.

3. The semiconductor structure of claim 2, wherein proximal horizontal surfaces of the dielectric isolation rails contact the insulating material layer.

4. The semiconductor structure of claim 3, wherein the metallic source contact layer comprises vertically-extending via portions that vertically extend through the substrate semiconductor layer and the insulating material layer and contact a distal surface of the semiconductor material layer.

5. The semiconductor structure of claim 2, wherein:
   the alternating stacks comprise stepped surfaces in which lateral extents of the electrically conductive layers decrease with a vertical distance from the semiconductor material layer; and
   the memory die further comprises stepped dielectric material portions contacting the stepped surfaces of the alternating stacks and contacting the semiconductor material layer.

6. The semiconductor structure of claim 5, wherein the memory die further comprises:
   a through-dielectric connection via structure vertically extending through one of the stepped dielectric material portions; and
   a through-substrate via structure vertically extending through the substrate semiconductor layer, the insulating material layer, and the semiconductor material layer and contacting the through-dielectric connection via structure.

7. The semiconductor structure of claim 2, wherein:
   the memory die further comprises line trench fill structures located within the line trenches and contacting each layer within a respective neighboring pair of the alternating stacks; and
   the line trench fill structures vertically extend into the semiconductor material layer.

8. The semiconductor structure of claim 1, wherein:
   the dielectric isolation rails are laterally spaced apart along the first horizontal direction and laterally extend along the second horizontal direction; and
   the dielectric isolation rails comprise silicon oxide.

9. The semiconductor structure of claim 1, wherein:
   the dielectric isolation rails are laterally spaced apart along the second horizontal direction and laterally extend along the first horizontal direction; and
   the dielectric isolation rails comprise silicon nitride.

10. The semiconductor structure of claim 1, wherein the memory die further comprises memory-side dielectric material layers embedding memory-side metal interconnect structures and vertically spaced from the substrate semiconductor layer by the alternating stacks.

11. The semiconductor structure of claim 10, further comprising a logic die bonded to the memory die, wherein the logic die comprises a peripheral circuit configured to control operation of the arrays of memory stack structures within the memory die.

12. The semiconductor structure of claim 11, wherein:
    the logic die comprises logic-side dielectric material layers embedding logic-side metal interconnect structures and logic-side bonding pads; and
    the memory-side dielectric material layers embed memory-side bonding pads that are bonded to the logic-side bonding pads.

13. The semiconductor structure of claim 1, wherein:
    each of the dielectric isolation rails has a proximal horizontal surface and the distal horizontal surface that is more distal from the alternating stacks along a vertical direction than the proximal horizontal surface;
    the proximal horizontal surface has a greater width along the first horizontal direction than the distal horizontal surface; and
    the dielectric isolation rails are arranged as a periodic one-dimensional array having a uniform pitch.

14. The semiconductor structure of claim 1, wherein each sidewall of the dielectric isolation rails vertically extends continuously from a horizontal top surface of the substrate semiconductor layer to a horizontal bottom surface of the substrate semiconductor layer.

15. The semiconductor structure of claim 1, wherein the alternating stacks and a horizontally-extending portion of the metallic source contact layer are located on opposite sides of the substrate semiconductor layer.

16. The semiconductor structure of claim 1, wherein:
    the memory die further comprises a semiconductor material layer having a first planar surface that is in contact with horizontal surfaces of the alternating stacks; and
    the metallic source contact layer comprises vertically-extending via portions that contact segments of a second planar surface of the semiconductor material layer that is vertically spaced from the first planar surface.

17. The semiconductor structure of claim 16, wherein each of the memory stack structures comprises a respective end surface that is located between a second horizontal plane including the first planar surface of the semiconductor material layer and a second horizontal plane including the second planar surface of the semiconductor material layer.

18. The semiconductor structure of claim 16, wherein:
- the memory die further comprises an insulating material layer that is located between the substrate semiconductor layer and the semiconductor material layer; and
- the vertically-extending via portions of the metallic source contact layer vertically extend through openings in the insulating material layer.

19. The semiconductor structure of claim 1, wherein:
- the memory die further comprises an insulating material layer located between the substrate semiconductor layer and the alternating stacks; and
- an entirety of each proximal horizontal surface of the dielectric isolation rails contacts a horizontal surface of the insulating material layer.

20. The semiconductor structure of claim 19, wherein the metallic source contact layer comprises vertically-extending via portions that extend through the substrate semiconductor layer and the insulating material layer.

* * * * *